(12) United States Patent
Hanada

(10) Patent No.: US 10,439,010 B2
(45) Date of Patent: Oct. 8, 2019

(54) DISPLAY DEVICE

(71) Applicant: Japan Display Inc., Tokyo (JP)

(72) Inventor: Akihiro Hanada, Tokyo (JP)

(73) Assignee: Japan Display Inc., Tokyo (JP)

(*) Notice: Subject to any disclaimer, the term of this patent is extended or adjusted under 35 U.S.C. 154(b) by 103 days.

(21) Appl. No.: 15/686,781

(22) Filed: Aug. 25, 2017

(65) Prior Publication Data

US 2018/0083076 A1 Mar. 22, 2018

(30) Foreign Application Priority Data

Sep. 21, 2016 (JP) .................................. 2016-184101

(51) Int. Cl.

| H01L 27/32 | (2006.01) |
| G02F 1/1362 | (2006.01) |
| G02F 1/1368 | (2006.01) |
| G09G 3/3225 | (2016.01) |
| G09G 3/36 | (2006.01) |
| H01L 27/12 | (2006.01) |
| H01L 29/786 | (2006.01) |

(52) U.S. Cl.
CPC ........ *H01L 27/3244* (2013.01); *G02F 1/1368* (2013.01); *G02F 1/136209* (2013.01); *G02F 1/136227* (2013.01); *G09G 3/3225* (2013.01); *G09G 3/3648* (2013.01); *H01L 27/124* (2013.01); *H01L 27/1214* (2013.01); *H01L 27/1225* (2013.01); *H01L 27/1248* (2013.01); *H01L 29/7869* (2013.01); *G09G 2300/0426* (2013.01); *G09G 2300/0842* (2013.01); *G09G 2320/0247* (2013.01); *H01L 29/78633* (2013.01)

(58) Field of Classification Search
CPC ............. H01L 27/3244; H01L 27/1214; H01L 27/1248; G02F 1/136209
USPC .......................................................... 257/40
See application file for complete search history.

(56) References Cited

U.S. PATENT DOCUMENTS

| 2011/0049508 A1 | 3/2011 | Kawamura et al. |
| 2013/0196468 A1 | 8/2013 | Yamazaki |
| 2015/0325602 A1* | 11/2015 | Im .................. H01L 27/1222 257/43 |

FOREIGN PATENT DOCUMENTS

| JP | 2011-54812 A | 3/2011 |
| JP | 2013-175718 A | 9/2013 |

* cited by examiner

*Primary Examiner* — Elias Ullah
(74) *Attorney, Agent, or Firm* — Michael Best & Friedrich LLP

(57) ABSTRACT

The purpose of the present invention is to form both LTPS TFT and semiconductor TFT in a same substrate. The feature of the display device to realize the above purpose is that: a display device having a display area containing a pixel comprising: the pixel includes a first TFT having an oxide semiconductor, a gate insulating film is formed on the oxide semiconductor, a first gate electrode is formed on the gate insulating film, a first source/drain electrode formed by a metal or an alloy contacts a source or a drain of the semiconductor the first gate electrode and the first source/drain electrode are formed by the same material.

8 Claims, 23 Drawing Sheets

FIG. 11
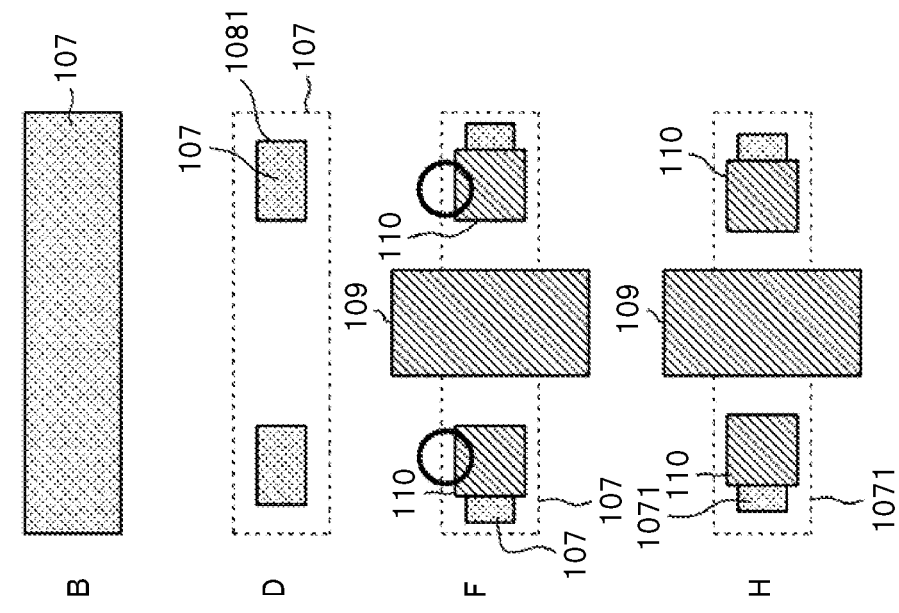
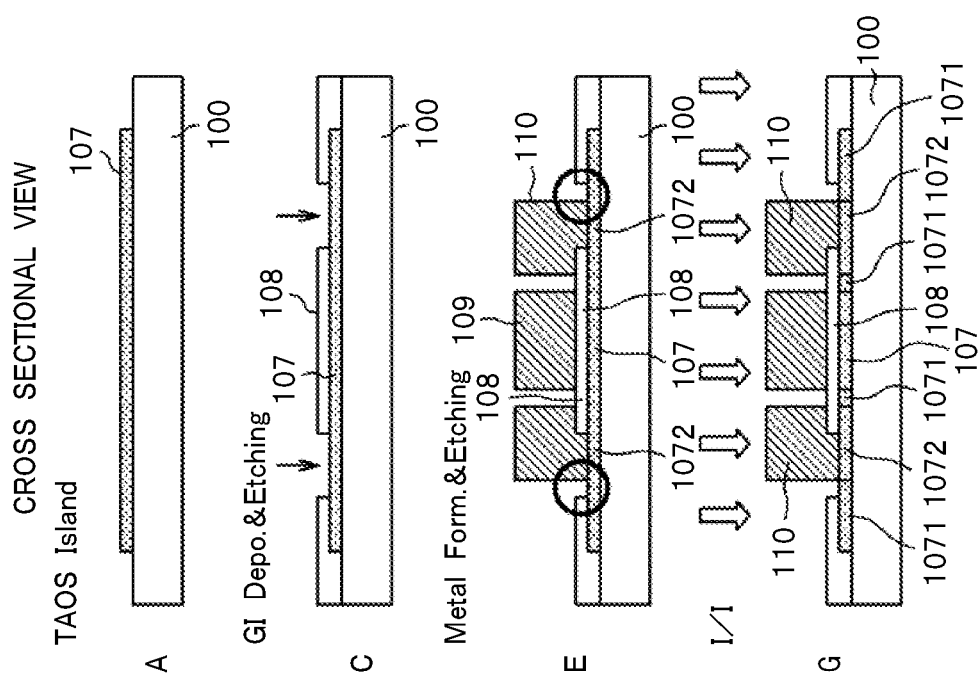

DISPLAY DEVICE

CROSS-REFERENCE TO RELATED APPLICATION

The present application claims priority from Japanese Patent Application JP 2016-184101 filed on Sep. 21, 2016, the content of which is hereby incorporated by reference into this application.

BACKGROUND OF THE INVENTION

(1) Field of the Invention

The present invention relates to a display device of hybrid structure, which includes both of a TFT of poly-silicon and a TFT of oxide semiconductor.

(2) Description of the Related Art

A liquid crystal display device comprises a TFT substrate where thin film transistors (TFT) and pixel electrodes are formed and a counter substrate opposing to the TFT substrate, wherein a liquid crystal layer is sandwiched between the TFT substrate and the counter substrate. Images are formed by controlling the transmittance of lights in each of pixels. On the other hand, an organic EL display device forms color images by an organic light emitting layer and a TFT formed in individual pixels. An organic EL display has a merit for a thin display compared to a liquid crystal display device since an organic EL display device doesn't need a backlight.

LTPS (Low Temperature Poly-Si) is suitable for a TFT in a driving circuit. On the contrary, an oxide semiconductor has a high OFF resistance, thus gives a TFT of low OFF current.

Japanese patent laid open 2013-175718 and Japanese patent laid open 2011-54812 disclose a TFT having an oxide semiconductor. Japanese patent laid open 2013-175718 discloses forming a metal oxide on a semiconductor, which constitutes channel, and to use the metal oxide as a gate insulating film. Japanese patent laid open 2011-54812 discloses to use a metal oxide or a semiconductor layer as a sacrificing layer for channel etching in a bottom gate type TFT having an oxide semiconductor.

SUMMARY OF THE INVENTION

A switching TFT in a pixel needs to have low leak current. A TFT of oxide semiconductor can make a low leak current TFT. An oxide semiconductor, which is amorphous and optically transparent, is called TAOS (Transparent Amorphous Oxide Semiconductor). TAOS includes IGZO (Indium Gallium Zinc Oxide), ITZO (Indium Tin Zinc Oxide), ZnON (Zinc Oxide Nitride), IGO (Indium Gallium Oxide), and so on. Herein after, an oxide semiconductor is represented by TAOS. TAOS has a character that a mobility of carriers is low, thus, sometimes it is difficult to form a driving circuit by the TFT of TAOS built in the display device. Herein after, a term of TAOS is also used as a term of TFT including TAOS in this specification.

On the other hand the TFT of LTPS has high carrier mobility, thus a driving circuit can be formed by the TFT of LTPS. Herein after, a term of LTPS is also used as a term of TFT including LTPS. Since the TFT of LTPS has a character that a leak current is comparatively high, a serially connected two TFTs of LTPS is used for a switching TFT.

Consequently, it is reasonable to use the TAOS for a switching element and to use the LTPS for a driving circuit. However, since LTPS and TAOS are different materials, there is a task to solve to form the LTPS and the TAOS on a same substrate. Namely, when forming a source electrode and a drain electrode in the LTPS TFT, it is necessary to clean a surface of the LTPS by hydrofluoric acid (HF) to remove surface oxide. Hydrofluoric acid (HF), however, dissolves TAOS, thus, a same process is not applicable for the LTPS and the TAOS.

A purpose of the present invention is to solve the above problem, and enables to form the LTPS TFT and the TAOS TFT on a same substrate by a common process.

The present invention solves the above problem; concrete structures are as follows:

(1) A display device having a display area containing a pixel comprising: the pixel includes a first TFT having an oxide semiconductor, a gate insulating film is formed on the oxide semiconductor, a first gate electrode is formed on the gate insulating film, a first source/drain electrode formed by a metal or an alloy contacts a source or a drain of the semiconductor the first gate electrode and the first source/drain electrode are formed by the same material.

(2) The display device according to (1), wherein the gate insulating film covers the oxide semiconductor, the first source/drain electrode contacts the source or the drain of the oxide semiconductor through a through hole formed in the gate insulating film.

(3) The display device according to (1), wherein the gate insulating film is formed in island shape to cover a channel portion of the first TFT, the gate insulating layer doesn't exist between the first source/drain electrode and the oxide semiconductor.

(4) The display device according to (1), wherein a driving circuit is formed outside of the display area, the driving circuit includes a second TFT having a Poly-Si semiconductor.

(5) A display device having a display area containing a pixel comprising: the pixel includes a first TFT having an oxide semiconductor, a gate insulating film is formed on the oxide semiconductor, a first gate electrode is formed on the gate insulating film, a first source/drain electrode formed by a metal or an alloy contacts a source or a drain of the semiconductor a first insulating film is formed to cover the oxide semiconductor, the gate electrode, and the first source/drain electrode, a second source/drain electrode connects with the first source/drain electrode through a through hole formed in the first insulating film, the first source/drain electrode exists at a bottom of the through hole formed in the first insulating film.

(6) The display device according to claim (5), wherein the gate insulating film is formed to cover the oxide semiconductor, the first source/drain electrode connects with a source or a drain of the first TFT through a through hole formed in the gate insulating film.

(7) The display device according to (5), wherein the gate insulating film is formed in island shape to cover a channel of the first TFT, the gate insulating film doesn't exists between the first source/drain electrode and the oxide semiconductor.

(8) The display device according to claim (5), wherein a driving circuit is formed outside of the display area, the driving circuit includes a second TFT having Poly-Si semiconductor.

BRIEF DESCRIPTION OF THE DRAWINGS

FIG. 11 is a third example of embodiment 2.

DETAILED DESCRIPTION OF THE PREFERRED EMBODIMENTS

The present invention will be described in detail referring to the following embodiments.

First Embodiment

Figure 1:
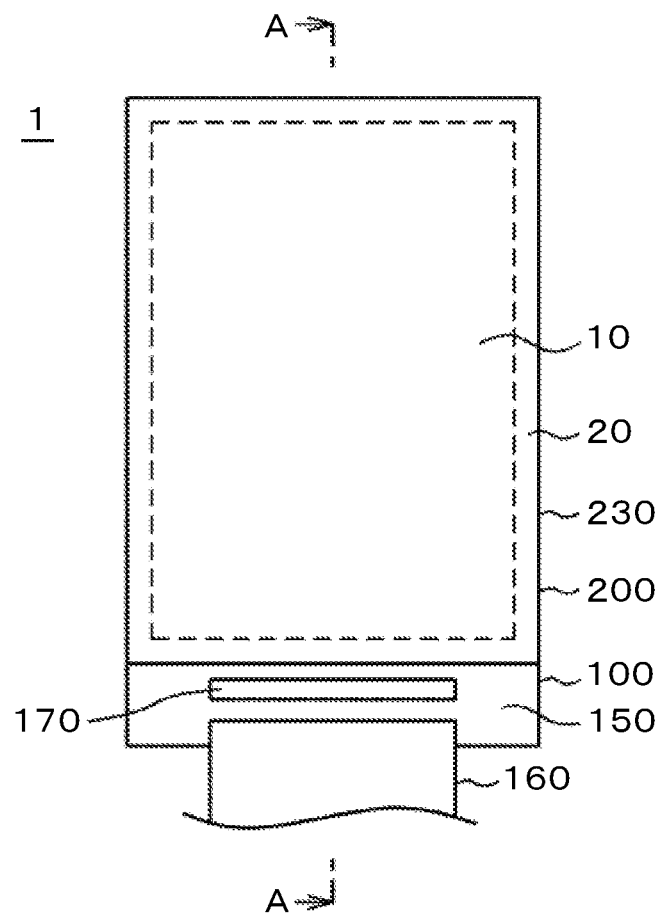
FIG. 1 is a plan view of a liquid crystal display device.
Figure 2:
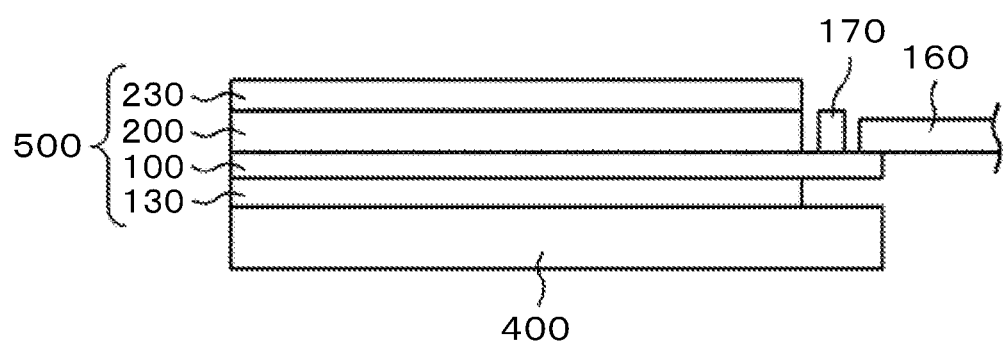
FIG. 2 is a cross sectional view along A-A of FIG. 1.

At the outset, the case is explained when the present invention is applied to a liquid crystal display device. FIG. 1 is a plan view of the liquid crystal display device 1 where the present invention is applied. FIG. 2 is a cross sectional view along A-A of FIG. 1. In FIG. 1 and FIG. 2, the TFT substrate 100 and the counter substrate 200 are opposed to each other and a liquid crystal layer is sandwiched between the TFT substrate 100 and the counter substrate 200. The lower polarizing plate 130 is attached underneath the TFT substrate 100; the upper polarizing plate 230 is attached on the counter substrate 200. An assembly of the TFT substrate 100, the counter substrate 200, the lower polarizing plate 130, and the upper polarizing plate 230 is called the liquid crystal display panel 500.

The TFT substrate 100 is bigger than the counter substrate 200, a portion of the TFT substrate 100 where the counter substrate 200 doesn't overlap is the terminal area 150. The driver IC 170 that supply video signals is installed on the terminal area 150. The flexible circuit substrate 160 is connected to the terminal area 160. The back light 400 is set at a back of the liquid crystal panel 500 since the liquid crystal display panel 500 doesn't emit light.

The liquid crystal display device 1 can be divided into the display area 10 and the peripheral area 20 as depicted in FIG. 1. Many pixels are formed in the display area 10 and each of the pixels has a switching TFT. A driving circuit, which drives scanning lines or video signal lines, is formed in the peripheral area 20.

A TFT that is used in a pixel must have low leak current. TAOS, which has low leak current, is suitable for a TFT in a pixel, while Poly-Si (Poly-Silicon), which has high mobility, is suitable for a driving circuit. Since the LTPS is often used as the Poly-Si in a liquid crystal display device, "Poly-Si" is sometimes described as "LTPS" in this specification. In a process of the LTPS TFT, through holes must be made in insulating layers, which covers the LTPS, to connect the LTPS with a drain electrode or a source electrode; in addition, cleaning of a surface of the LTPS by hydrofluoric acid (HF) at the through holes is necessary to remove oxide from the surface of the LTPS.

However, when the same process is applied to the TAOS TFT, the TAOS is dissolved by hydrofluoric acid (HF) at through holes, as a result, the TAOS TFT cannot be realized. Therefore, this problem must be solved to realize to form both the LTPS TFT and the TAOS TFT on the same substrate. The structure that solves this problem is explained referring to FIGS. 3-8.

Figure 3:
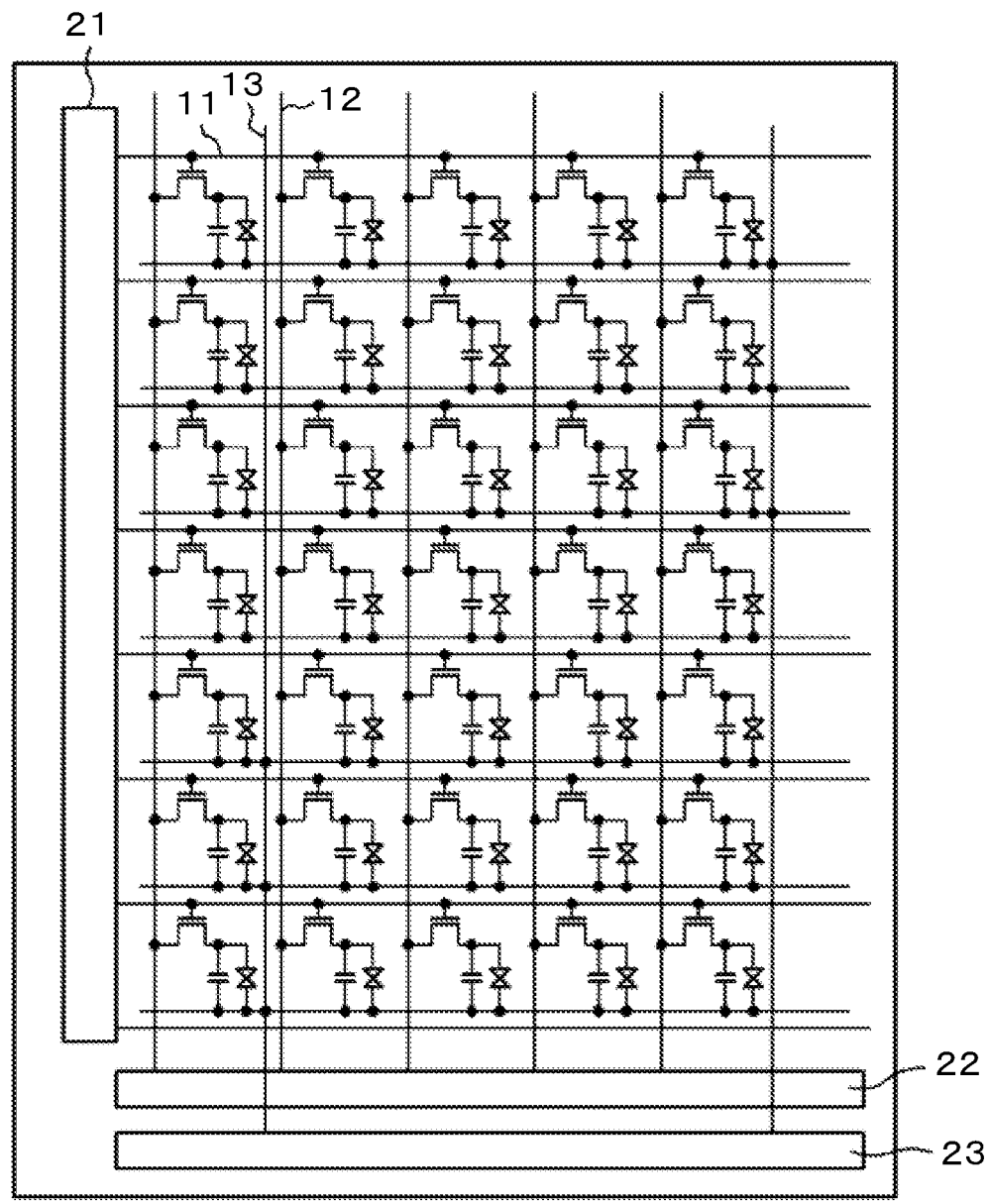
FIG. 3 is an equivalent circuit of a liquid crystal display device.

FIG. 3 is an equivalent circuit of a liquid crystal display device. In FIG. 3, the scanning lines 11 extend in lateral direction and arranged in longitudinal direction in a display area. The video signal lines extend in longitudinal direction and arranged in lateral direction. A pixel is formed in an area surrounded by the scanning lines 11 and the video signal lines 12. Each pixel has a switching TFT of the TAOS and a liquid crystal layer; and a storage capacitance is formed in parallel to the liquid crystal layer. The liquid crystal is driven by a pixel electrode and a common electrode. A pixel electrode connects with a source of the TFT; the common electrode connects with the common line 13. Generally, a fixed voltage is supplied to the common line 13 from the common line driving circuit 23.

In FIG. 3, the scanning line driving circuit 21 is set at left side of the display area. This scanning line driving circuit 21 is formed by TFTs of Poly-Si and is built in the TFT substrate. The video signal line driving circuit 23 is formed at lower side (longitudinally lower side in FIG. 3) of the display area.

Poly-Si TFTs are used in a peripheral circuit, while TAOS TFTs are used in the display area. The display area and the peripheral area are formed simultaneously. In this case, in the Poly-Si TFT, the poly-Si at through holes must be cleaned by hydrofluoric acid (HF) before forming source/drain electrode, however, at the same time TAOS at through holes are cleaned by hydrofluoric acid (HF). The problem is that the TAOS is dissolved by the hydrofluoric acid (HF), as a result, the TAOS disappears at the through holes.

Figure 4:
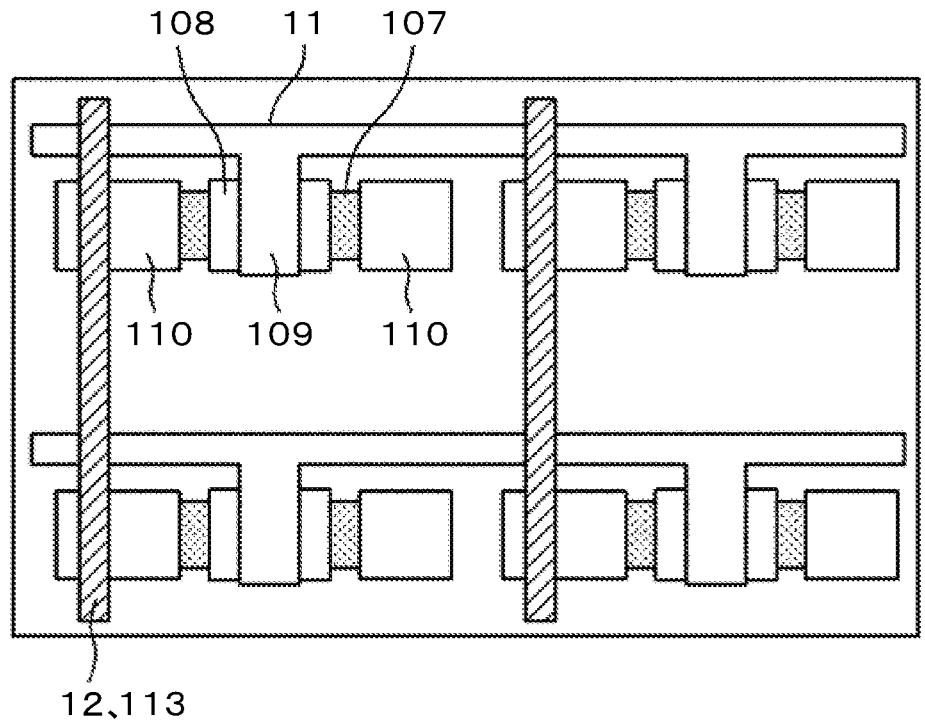
FIG. 4 is a plan view of an oxide semiconductor TFT.

FIG. 4 is a plan view of the TAOS TFT in each pixel. In FIG. 4, a pixel is formed in an area surrounded by the video signal lines 12 and the scanning lines 11, a TFT using the TAOS 107 is formed in the pixel. The gate insulating film 108 is formed to cover a part of the TAOS 107. The gate electrode 109, diverged from the scanning line 11, is set on the gate insulating film 108. A part of the TAOS 107, which overlaps with the gate electrode 109, is a channel.

The source electrode 110 or the drain electrode 110 is formed at both sides of the TAOS. Herein after, the source electrode 110 and the drain electrode 110 may be called source/drain electrode 110. One of the source/drain electrodes 110 connects with the video signal line 12 and another of the source/drain electrodes 110 connects with the pixel electrode. In FIG. 4, the source/drain electrodes 110 and the video signal line 12 are connected via through hole.

Figure 5:
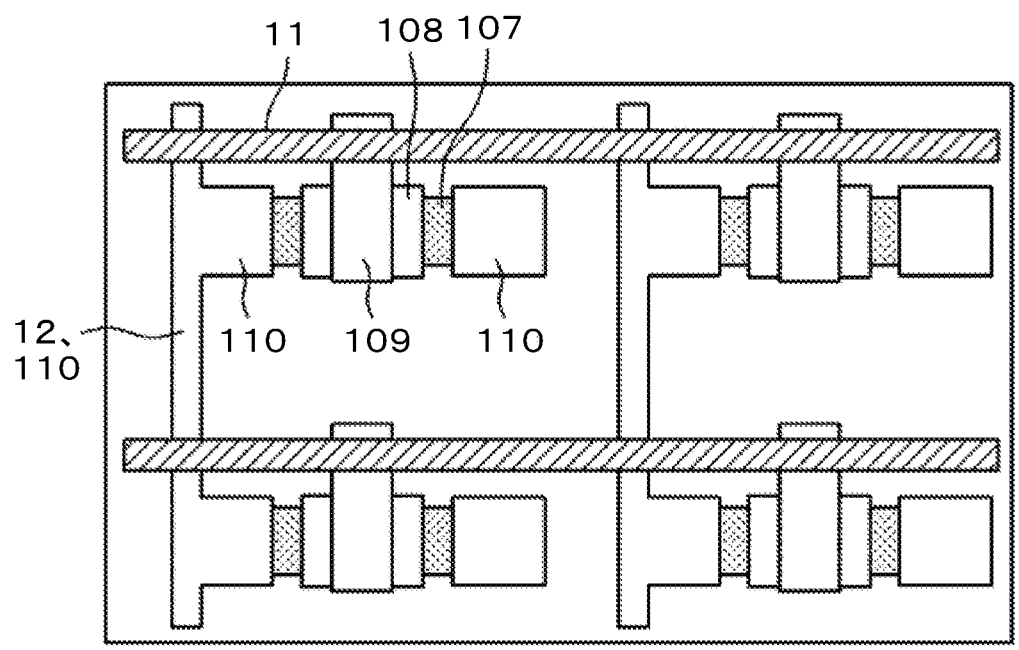
FIG. 5 is a plan view of another example of an oxide semiconductor TFT.

FIG. 5 is a plan view, which shows another example of the TAOS TFT in each pixel. FIG. 5 is different from FIG. 4 in that a diverged video signal line 12 forms one of the source/drain electrodes 110, and the gate electrode 109 connects with the scanning line 11 via a through hole. A problem, which arises when the Poly-Si TFT and the TAOS TFT are formed on the same substrate, is common in FIG. 4 and FIG. 5. Herein after, the present invention is explained referring to FIG. 4.

Figure 6:
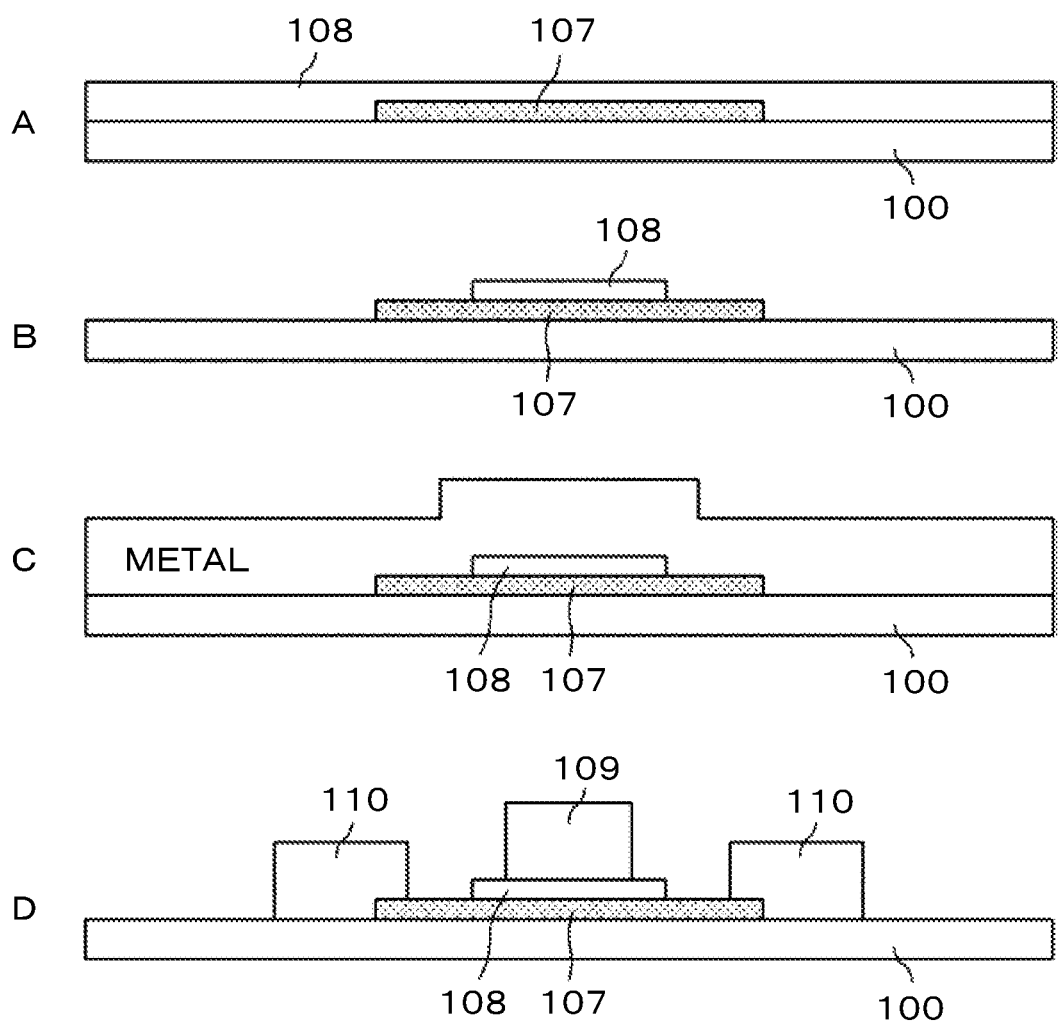
FIG. 6 is cross sectional views showing structures of an oxide semiconductor TFT in a various manufacturing processes according to the preset invention.

FIG. 6 is cross sectional structures of the TAOS TFT in a various manufacturing processes according to the present invention. FIG. 6 shows only the layers constituting the TAOS TFT, and other layers are omitted. A of FIG. 6 shows: the TAOS 107, formed on the TFT substrate 100 of e.g. glass, is patterned and covered by the gate insulating film 108. B of FIG. 6 is a cross sectional view that shows the gate insulating film 108 is patterned.

C of FIG. 6 is a cross sectional view that shows the metal film (METAL) is formed on the gate insulating film 108 and the TAOS 107. The metal film is formed e.g. by a laminated film of Ti—Al Alloy-Ti. D of FIG. 6 is a cross sectional drawing that shows the metal film is patterned to form the source/drain electrodes 110 and the gate electrode 109.

The feature of FIG. 6 is to form the source/drain electrodes 110 and the gate electrode 109 simultaneously by the same metal. Thanks to the structure, dissolving of the TAOS by the hydrofluoric acid (HF) at the thorough holes can be avoided during cleaning the through holes, which are formed in an insulting layer that covers the gate electrode 109 and the source/drain electrodes 110. The reason is that the through holes are formed on the source/drain electrodes 110 on the TAOS semiconductor.

Figure 7:
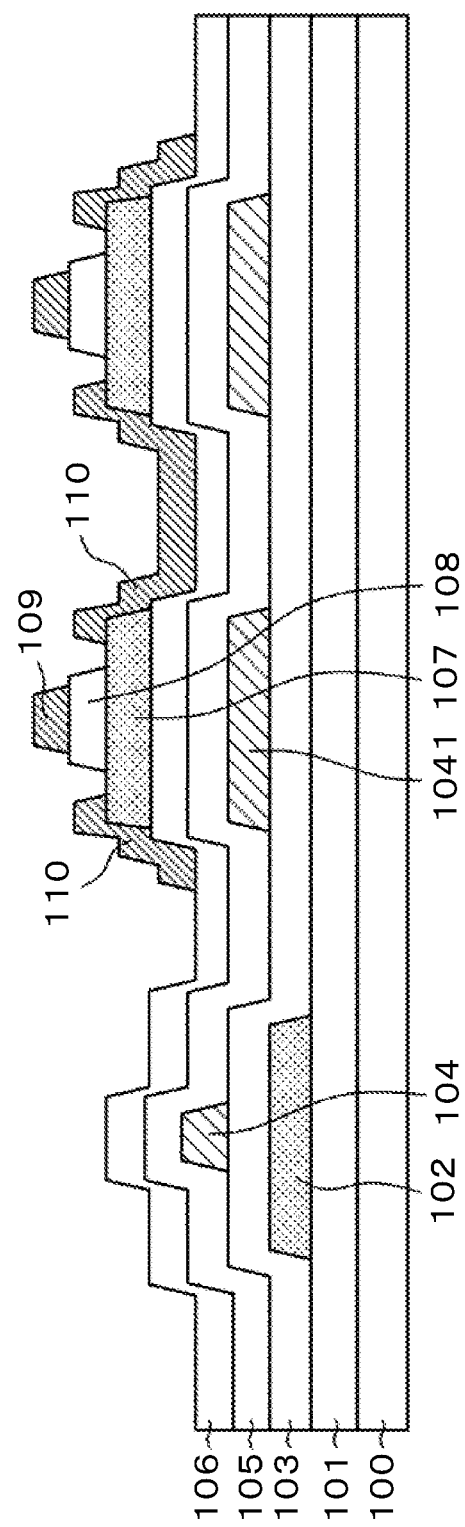
FIG. 7 is a cross sectional view of the oxide semiconductor TFT and the LTPS TFT at interim process according to the present invention.
Figure 8:
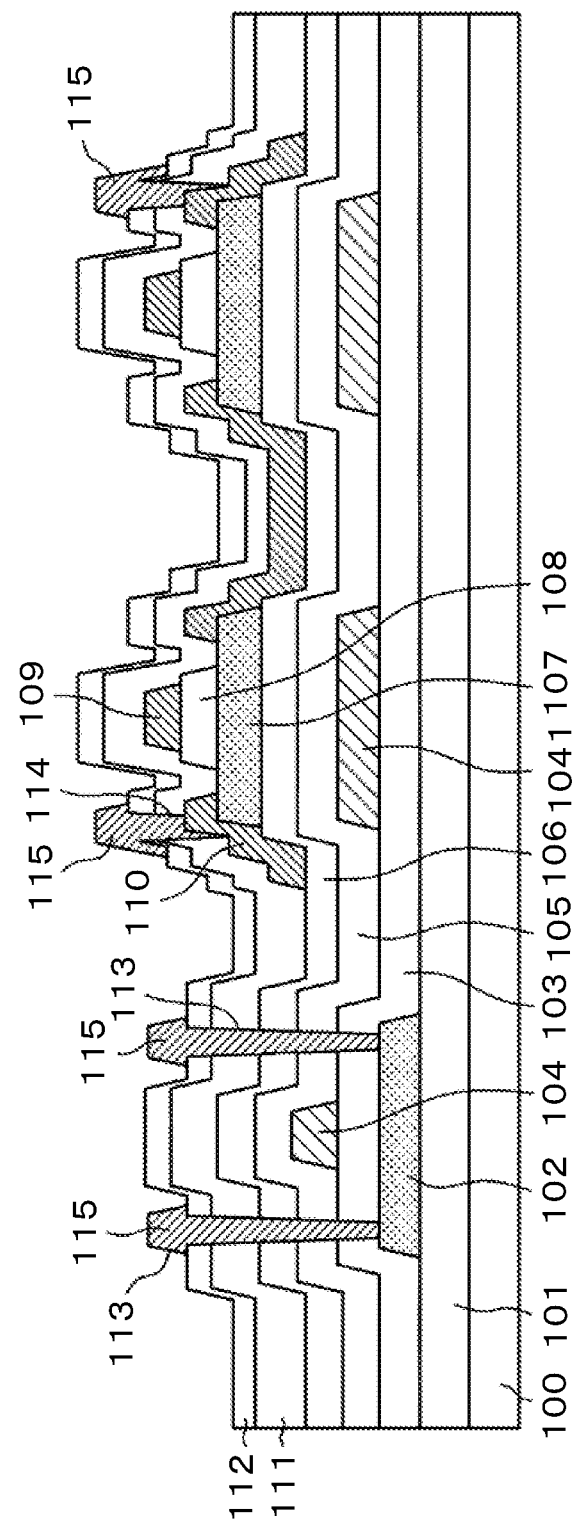
FIG. 8 is a cross sectional view of the oxide semiconductor TFT and the LTPS TFT according to the present invention.

FIGS. 7 and 8 are detailed cross sections showing a structure and a manufacturing process thereof according to the present invention. In FIGS. 7 and 8, the left hand figure is a Poly-Si TFT used in a driving circuit formed in peripheral area, while the right hand figure is a TAOS TFT used in pixel area.

In FIG. 7, the undercoat 101 is formed on the TFT substrate 100 formed by glass or resin. The undercoat 101 is to block impurities from the TFT substrate 100 such as glass; the undercoat 101 is generally formed by SiO, SiN, or a laminated film of SiO layer and SiN layer. In this specification, a notation of AB (e.g. SiO) means a compound formed by A and B; however, it doesn't necessarily mean A and B are the same amount; even a basic ratio of elements exists, according to process conditions, a ratio between A and B becomes different from the basic ratio.

The semiconductor layer 102 of Poly-Si for the Poly-Si TFT is formed on the undercoat 101. The first gate insulating film 103 is formed covering the Poly-Si semiconductor layer 102; the first gate electrode 104 is formed on the first gate insulating film 103. The gate electrode 104 is formed by e.g. a lamination film of Ti/Al alloy-Ti, or MoW alloy. The light blocking layer 1041 is simultaneously formed at a place where the TAOS TFT is formed, in a plan view, in the display area to suppress a photo current in the TAOS 107.

The first interlayer insulating film 105 by SiN is formed on the first gate electrode 104; then the second interlayer insulating film 106 is formed on the first interlayer insulating film 105. The TAOS 107 is formed on the second interlayer insulating film 106. The second gate insulating film 108 is formed on the TAOS 107, and the second gate insulating film 108 is patterned. It is preferable to form the second interlayer insulating film 106 and the second gate insulating film 108 by SiO so as to sandwich the TAOS 107. The reason is that SiN discharges hydrogen, which deteriorates characteristics of the TAOS 107.

After that, the metal layer is formed on the second gate insulating film 108 and the TAOS 107; then the metal layer is patterned to form the second gate electrode 109 and source/drain electrodes 110 simultaneously.

After that, as depicted in FIG. 8, the third interlayer insulating film 111 is formed on the second gate electrode 109 and the source/drain electrodes 110, then, the fourth interlayer insulating film 112 is formed on the third interlayer insulating film 111. It is preferable to form the third interlayer insulating film 111 by SiO and to form the fourth interlayer insulating film 112 by SiN. It is possible to form the fourth interlayer insulating film 112 directly on the second gate electrode 109 and the source/drain electrodes 110 without forming the third interlayer insulating film 111.

After that, at the Poly-Si TFT, through holes 113 are formed in the first interlayer insulating film 105 through the fourth interlayer insulating film 112, while, at the TAOS TFT, through holes 114 are formed in the third interlayer insulating film 111 and the fourth interlayer insulating film 112. Through holes 113 and through holes 114 are formed simultaneously. Those through holes are made by dry etching with CF (CF4) based gas or with CHF (CHF3) based gas.

The through holes 113 are made through 5 layers while the through holes 114 are made through 2 layers; however, in the through holes 114, the source/drain electrodes 110 can be an etching stopper, thus, simultaneous forming of the through holes 113 and the through holes 114 is possible.

After forming the through holes 113 and the through holes 114, cleaning of the through holes by hydrofluoric acid (HF) is necessary. The through holes 114 are also cleaned by hydrofluoric acid (HF), however, the source/drain electrodes 110 can be an etching stopper, thus, the hydrofluoric acid (HF) doesn't contact to the TAOS 107. Therefore, TAOS is not dissolved by the hydrofluoric acid (HF).

As described above, according to the present invention, the Poly-Si TFT and the TAOS TFT can be formed on the same substrate and by a common process. Therefore, it is possible to form TFTs of less leak current in the display area, and to form TFTs of high speed in the peripheral driving circuit.

Second Embodiment

FIGS. 9-15 are figures of the structures and manufacturing processes according to embodiment 2 of the present invention. In FIGS. 9-15, the left hand figures are a cross sectional views, while the right hand figures are plan views. In FIGS. 9-15, layers not relating to the TAOS are omitted.

Figure 9:
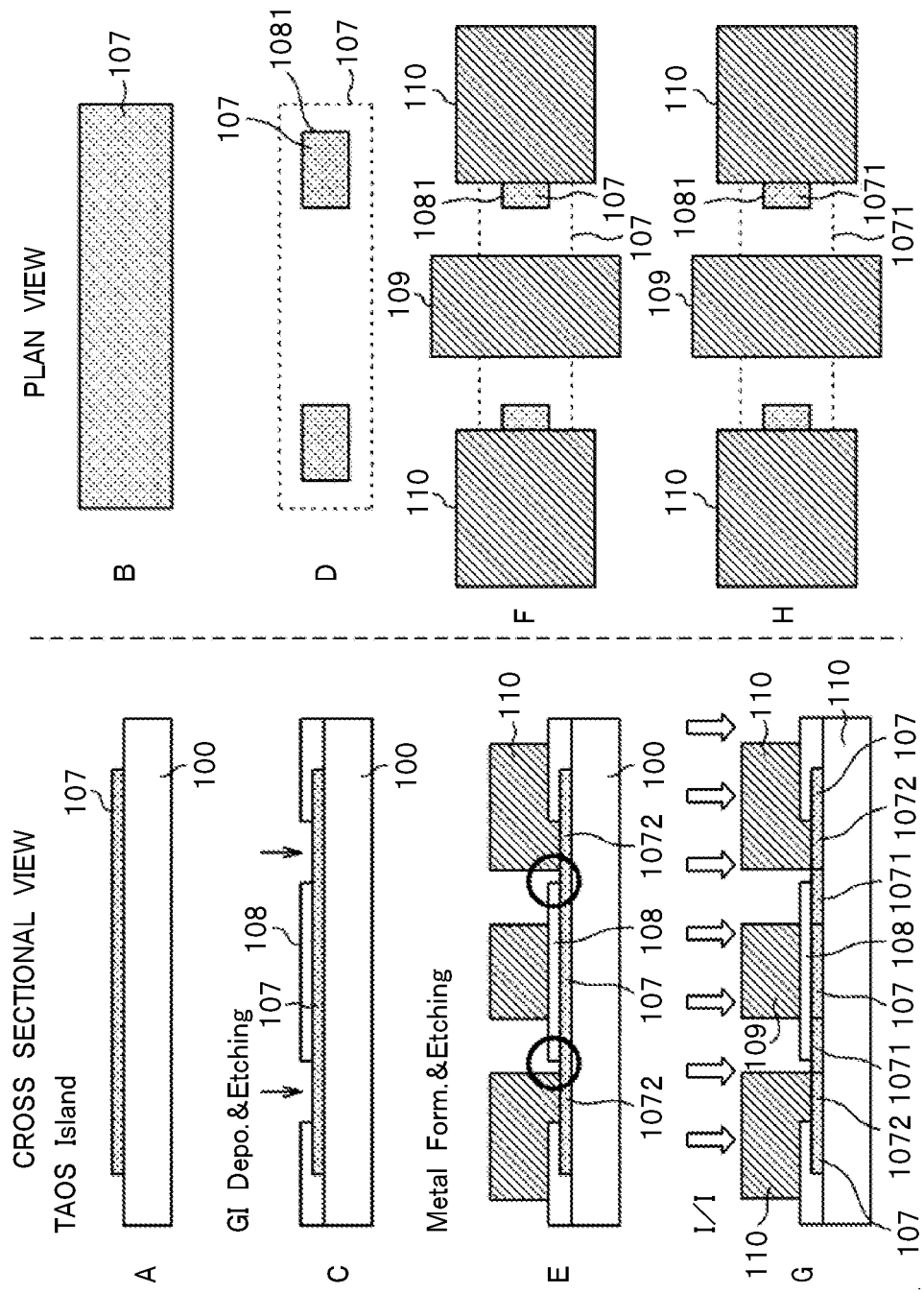
FIG. 9 is a first example of embodiment 2.

A and B of FIG. 9 are figures that TAOS 107 is formed on the substrate 100 and patterned in island shape. C and D of FIG. 9 are figures that the gate insulating film 108 is formed on the TAOS 107 and the through holes 1081 are made in the gate insulating film 108. E and F of FIG. 9 are figures that the metal film is formed on the gate insulating film 108 and the TAOS 107, and the metal film 108 is patterned.

As emphasized by the circles in E of FIG. 9, it is important there is an area that the TAOS 107 doesn't overlap with the source/drain electrodes 110, that is to say, there is an exposed area in the TAOS. After the ion implantation, which is explained later, the source/drain electrode 110 and a channel of the TAOS 107 are electrically connected through this exposed area of the TAOS. In E and F of FIG. 9, the source/drain electrodes 110 extract oxygen from the TAOS 107 in areas 1072 where the TAOS 107 contacts with the source/drain electrodes 110; thus, the TAOS becomes conductive in these areas.

G of FIG. 9 is a figure that the ion implantation (I/I) is made on the structure of E of FIG. 9, thus a doped area 1071 is formed in the TAOS 107. In the ion implantation (I/I), ion can be either one of B (Boron), P (Phosphor), Ar (Argon) etc. however, it is not necessary to limit kinds of ion. The purpose of the ion implantation (I/I) is to destroy the basic structure of the TAOS 107, thus, to give the TAOS 107 conductivity; therefore, kinds of ion can be chosen widely.

G of FIG. 9, the area indicated by 1071 is a conductive area of the TAOA 107. The area 1072 where the source/drain electrode 110 and TAOS 107 contact each other is also a conductive area of the TAOS 107. Thus, a drain and a source are formed sandwiching the cannel 107 of the TAOS.

In H of FIG. 9, the area of the TAOS 107 that is not covered by the gate electrode 109 and the source/drain electrode 110 is conductive since ion is doped in this area. ON current flows through the area 1071 of H of FIG. 9 to the source/drain electrode 110. In other words, the circled portion in E of FIG. 9 is a route where the current flows to the source/drain electrode 110.

Figure 10:
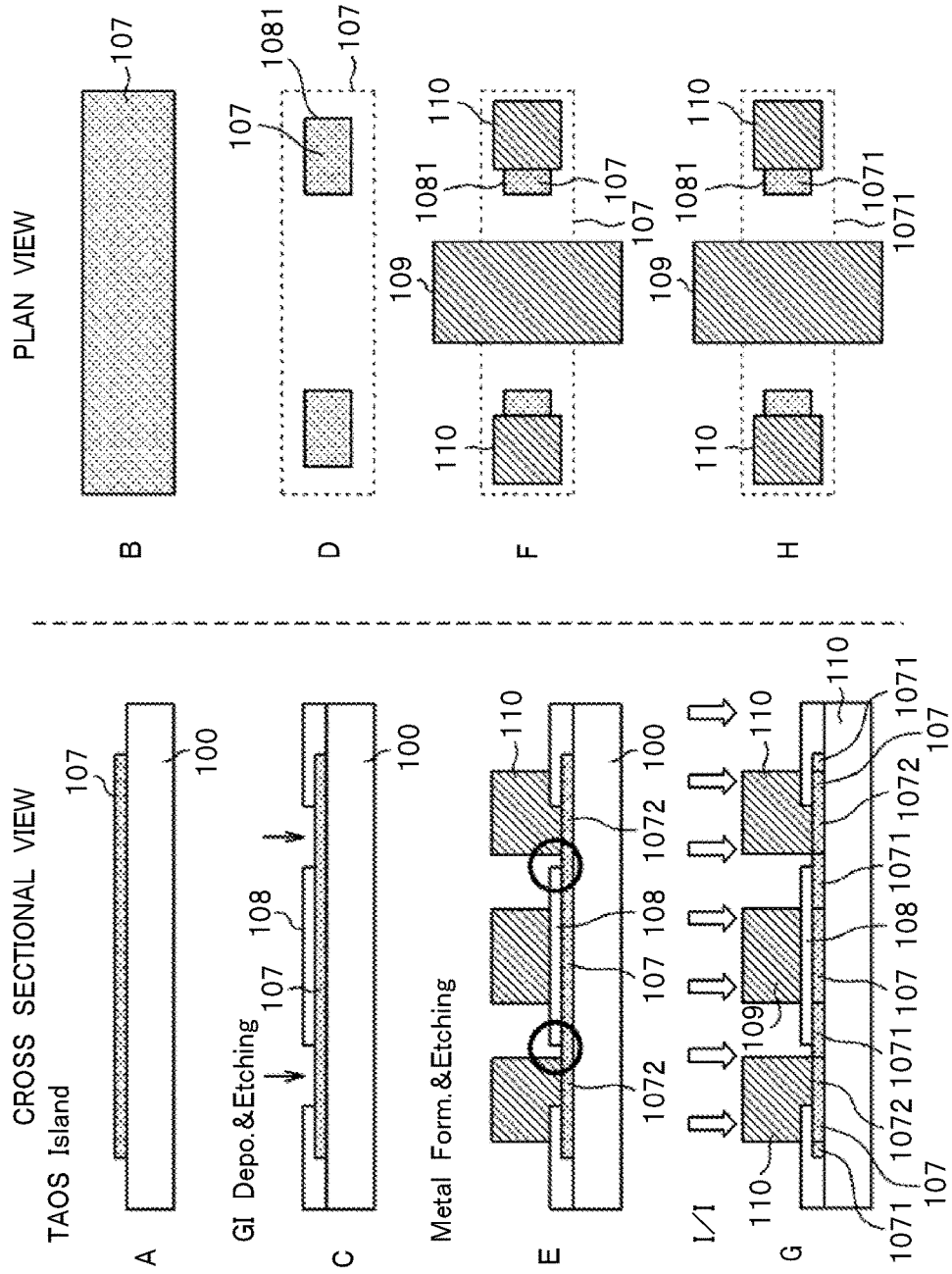
FIG. 10 is a second example of embodiment 2.

FIG. 10 is a second example of a structure of the TAOS TFT in embodiment 2. F and H of FIG. 10 are different from F and H of FIG. 9 in that a width of the source/drain electrodes 10 is narrower in F and H of FIG. 10 than that of F and H of FIG. 9. In FIG. 10, TAOS 107 around the source/drain electrode 110 becomes conductive after the ion implantation (I/I), however, a route where the current flows to the source/drain electrode 110 is the same as FIG. 9. That is to say, the current flows to the source/drain electrodes 110 through the circled portions E of FIG. 10.

FIG. 11 is a third example of a structure of TAOS TFT in embodiment 2. F and H of FIG. 11 are different from F and H of FIG. 10 in that the exposed portions 1071 of TAOS 107 are located at outer sides of the source/drain electrode 110, namely, exposed portions 1071 in FIG. 11 are located in more remote areas from the gate electrode 109 compared to in the case of FIG. 10. That is to say the circled portions in E of FIG. 11 are routes for the current to the source/drain electrodes 110. The circled portions of F in FIG. 11 cannot be routes of the current to the source/drain electrodes 110. The structure of FIG. 11 is used in some specific layouts; however, performance of TFTs is the same between FIG. 10 and FIG. 11.

Figure 12:
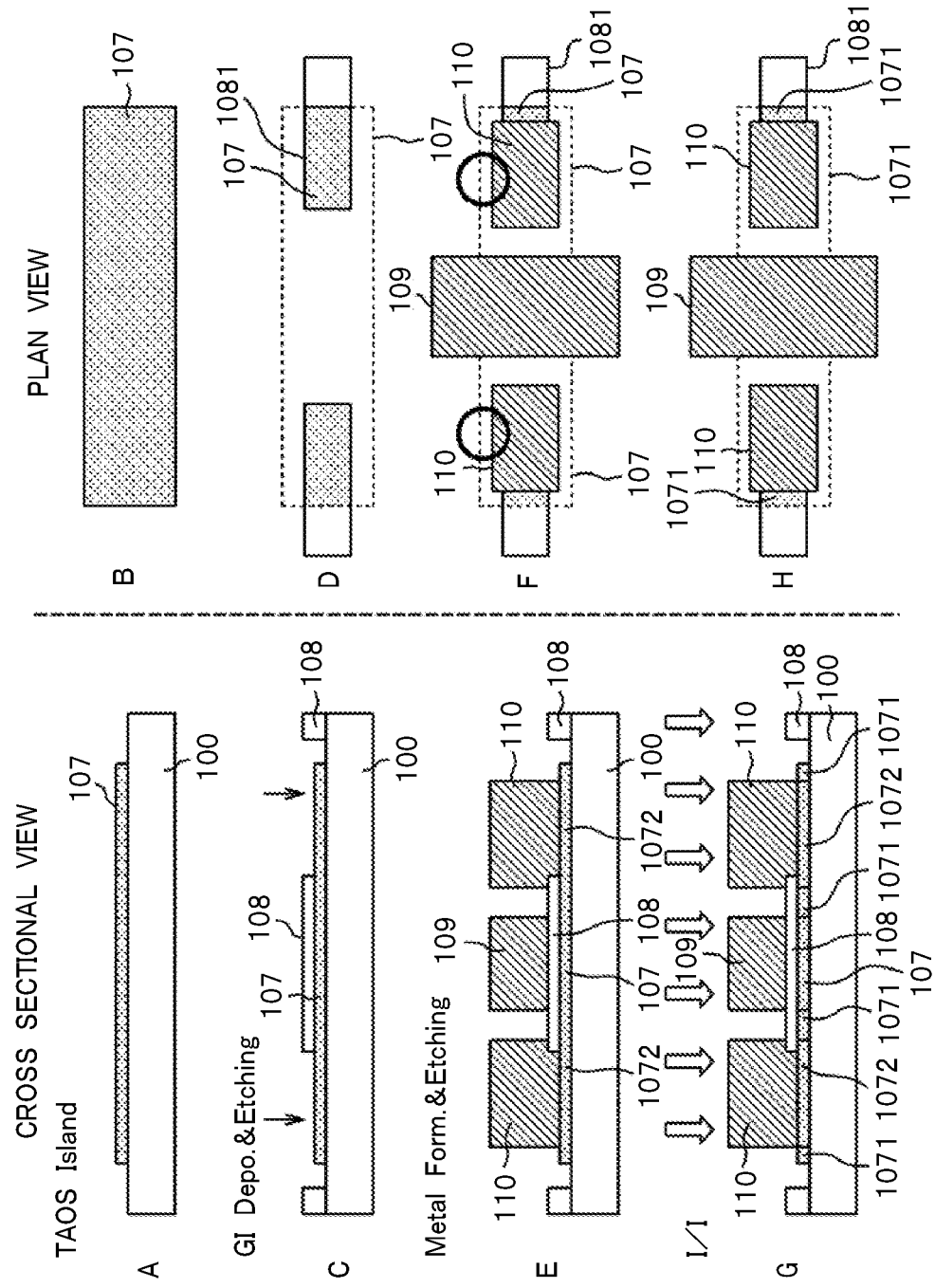
FIG. 12 is a fourth example of embodiment 2.

FIG. 12 is a fourth example of a structure of the TAOS TFT in embodiment 2. FIG. 12 differs from FIG. 10 in that the through hole 1081 formed in the gate insulating layer 108 extends beyond the outer edge of TAOS the 107. FIG. 11 further differs from FIG. 10 in that exposed portions of TAOS 107 are located at outer sides of the source/drain electrode 110, which are more remote areas from the gate electrode 109.

In F of FIG. 12, exposed areas of the TAOS 107 can be routes for the current to the source/drain electrodes 110, however, the circled portions in F of FIG. 12 cannot be routes for the current to the source/drain electrodes 110. The structure of FIG. 12 is used in some specific layouts; however, performance of TFTs is the same between FIG. 10 and FIG. 12.

Figure 13:
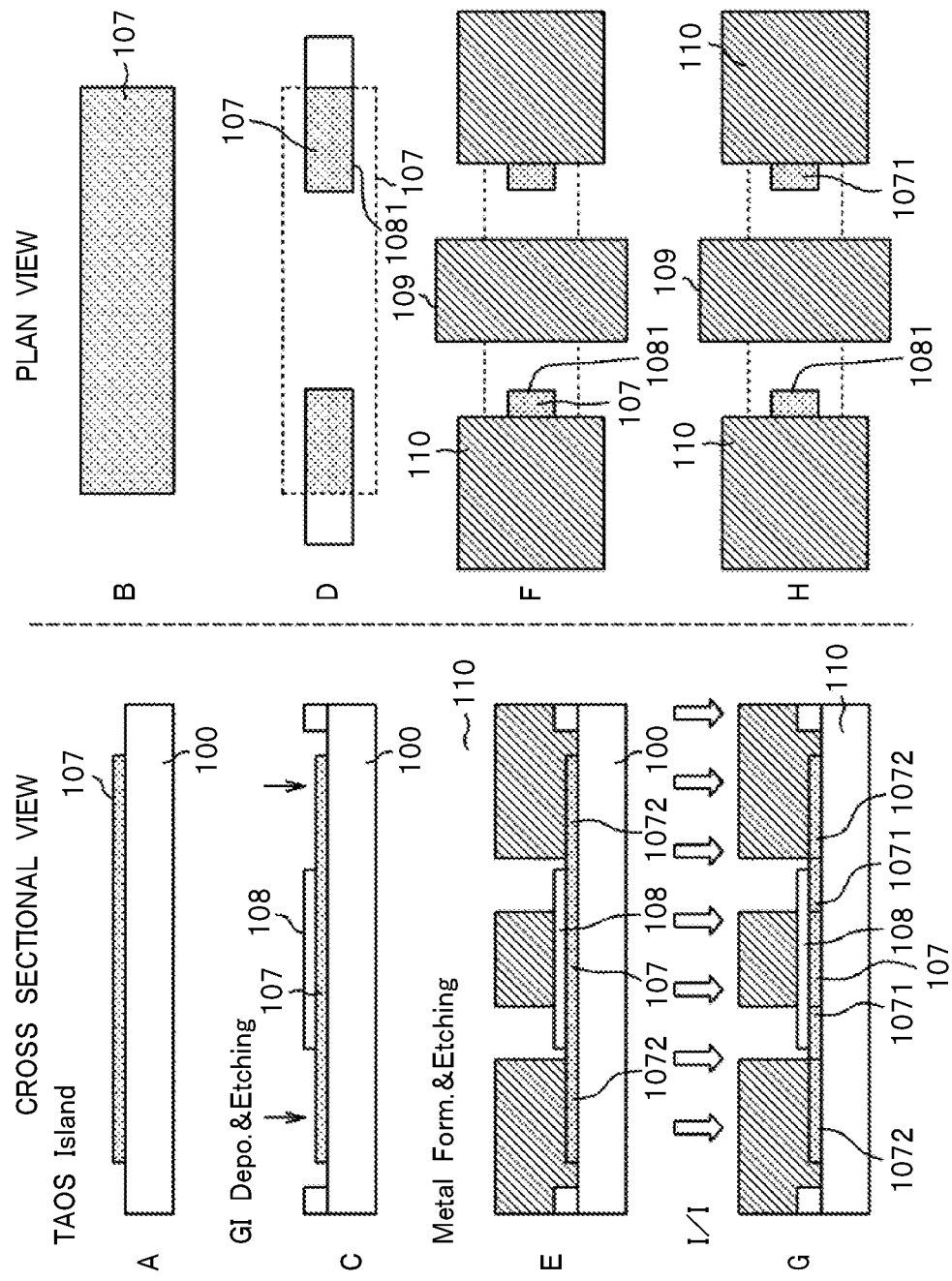
FIG. 13 is a fifth example of embodiment 2.

FIG. 13 is a fifth example of a structure of the TAOS TFT in embodiment 2. FIG. 13 differs from FIG. 9 in that the through hole 1081 formed in the gate insulating layer 108 extends beyond the outer edge of the TAOS 107. In E of FIG. 13, routes of the current to the source/drain electrodes are exposed areas of the TAOS 107, which are the same as E of FIG. 9. The structure of FIG. 13 is used in some specific layouts; however, performance of TFTs is essentially the same between FIG. 9 and FIG. 13.

Figure 14:
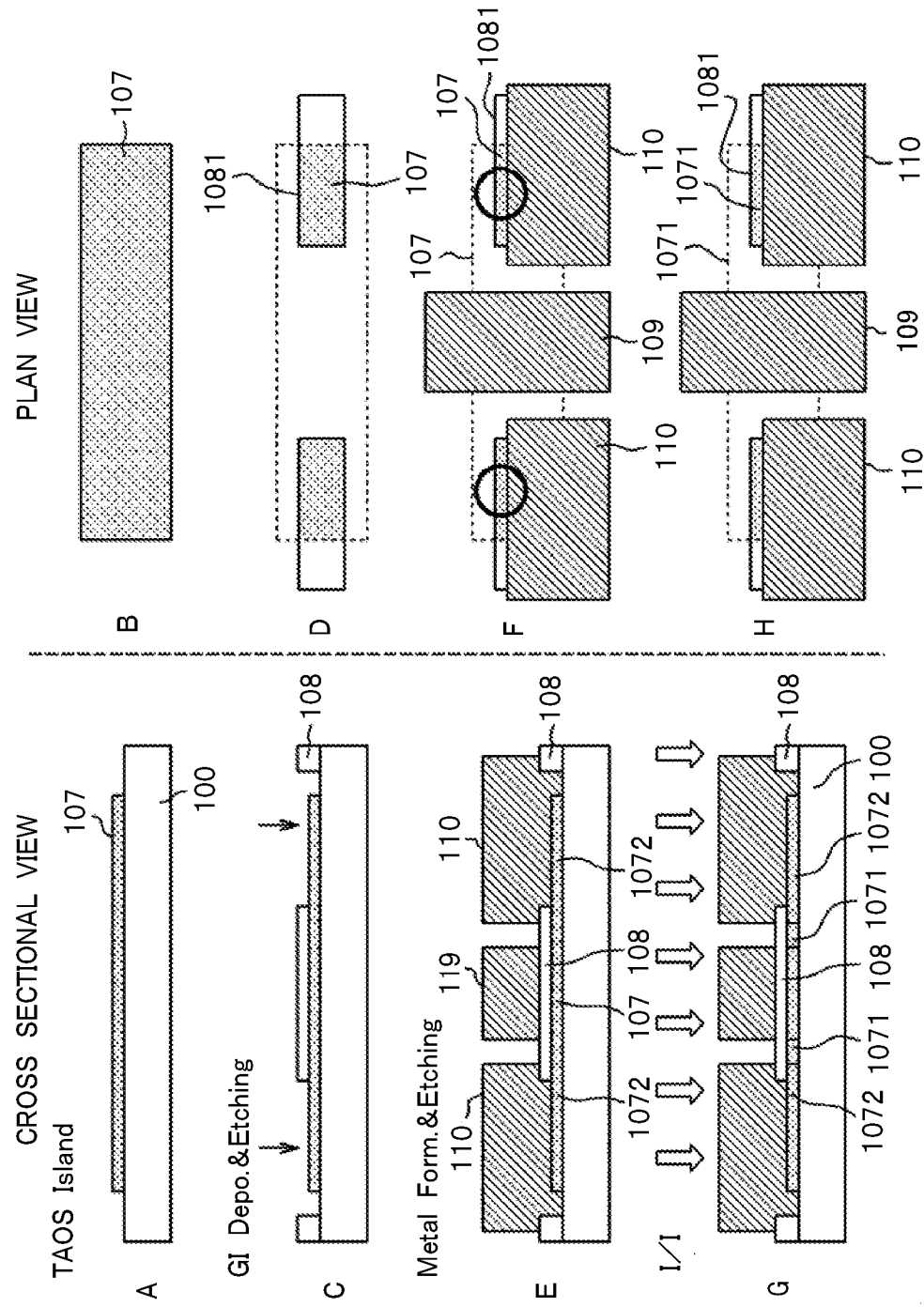
FIG. 14 is a sixth example of embodiment 2.

FIG. 14 is a sixth example of a structure of the TAOS TFT in embodiment 2. FIG. 14 differs from FIG. 13 in that exposed areas of the TAOS in the through holes 1081 of the gate insulating film 108 extend along a channel direction of the TAOS TFT. The circled portions in F of FIG. 14 are routes of the current to the source/drain electrodes 110. The structure of FIG. 14 is used in some specific layouts; however, a performance of TFTs is essentially the same between FIG. 13 and FIG. 14.

Figure 15:
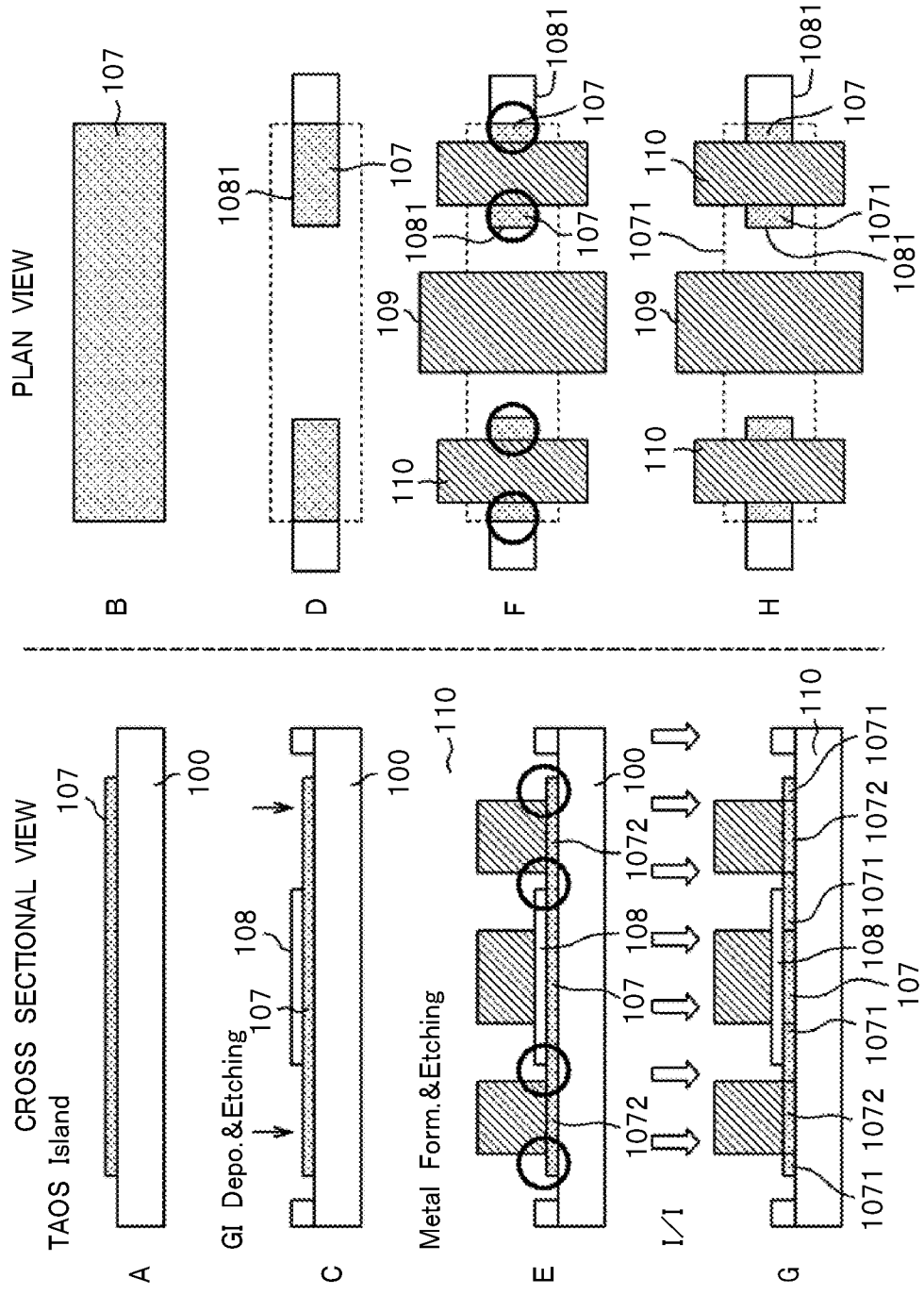
FIG. 15 is a seventh example of embodiment 2.

FIG. 15 is a seventh example of a structure of the TAOS TFT in embodiment 2. FIG. 15 differs from FIG. 13 in that a width of the source/drain electrodes 110 is narrow, thus, exposed areas of the TAOS exist at both sides of the source/drain electrode 110 in the through hole 1081 in the gate insulating film 108. Other structures are the same as explained in FIG. 13.

A common feature through FIGS. 9-15 is that, in H of each of FIGS. 9-15, an exposed area of the TAOS 107 adjacent to the source/drain electrode 110 forms a route of the current to the source/drain electrode 110.

Third Embodiment

FIGS. 16-22 are figures of the structures and manufacturing processes according to embodiment 3 of the present invention. In FIGS. 16-22, the left hand figures are cross sectional views, while the right hand figures are plan views. In FIGS. 16-22, layers not relating to the TAOS are omitted.

Figure 16:
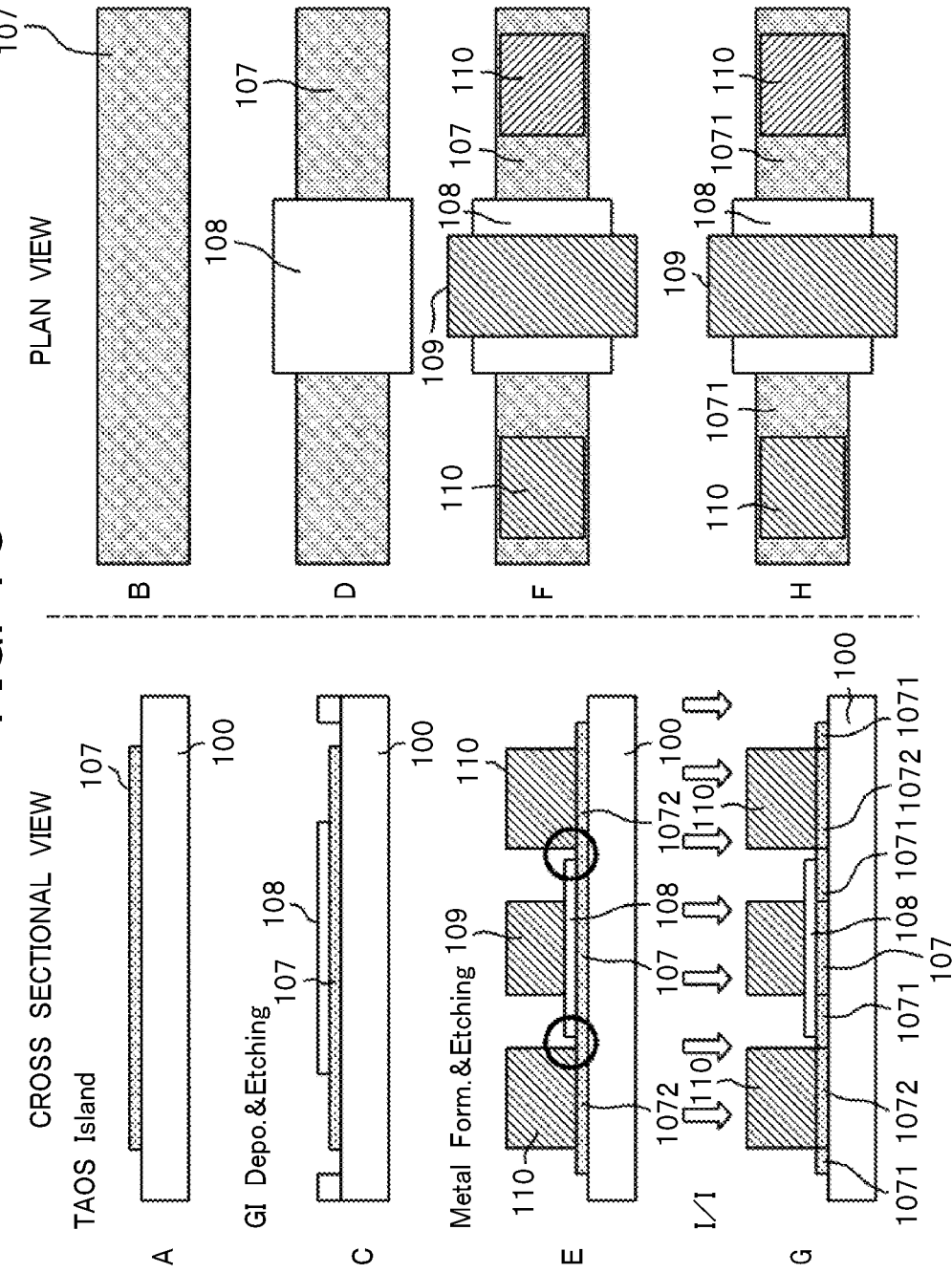
FIG. 16 is a first example of embodiment 3.

A and B of FIG. 16 are figures that the TAOS 107 is formed on the substrate 100 and patterned in island shape. C and D of FIG. 16 are figures that the gate insulating film 108 is formed on the TAOS 107 and is patterned in island shape.

E and F of FIG. 16 are figures that the gate electrode 109 is formed on the gate insulating film 108; and the source/drain electrodes 110 are directly formed on TAOS 107 at both sides of the TAOS 107. A portion of the TAOS 107, where the source/drain electrodes 110 contacts, is conductive since oxygen is extracted from the TAOS 107 by the metal or the alloy, which constitutes the source/drain electrode 110.

After that, as depicted in G of FIG. 16, the TAOS 107, which is not covered by the gate electrode 109 or by the source/drain electrode 110, becomes conductive by the ion implantation (I/I). The reason is the same as explained in FIG. 9. Consequently, as depicted in H of FIG. 16, an area of the TAOS 107 around the source/drain electrode 110 becomes conductive. ON current flows into the source/drain electrode 110 from all around the source/drain electrode 110 in FIG. 16; thus, ON resistance can be made low. By the way, the circled portions in E of FIG. 16 are areas that become conductive after the ion implantation (I/I).

Figure 17:
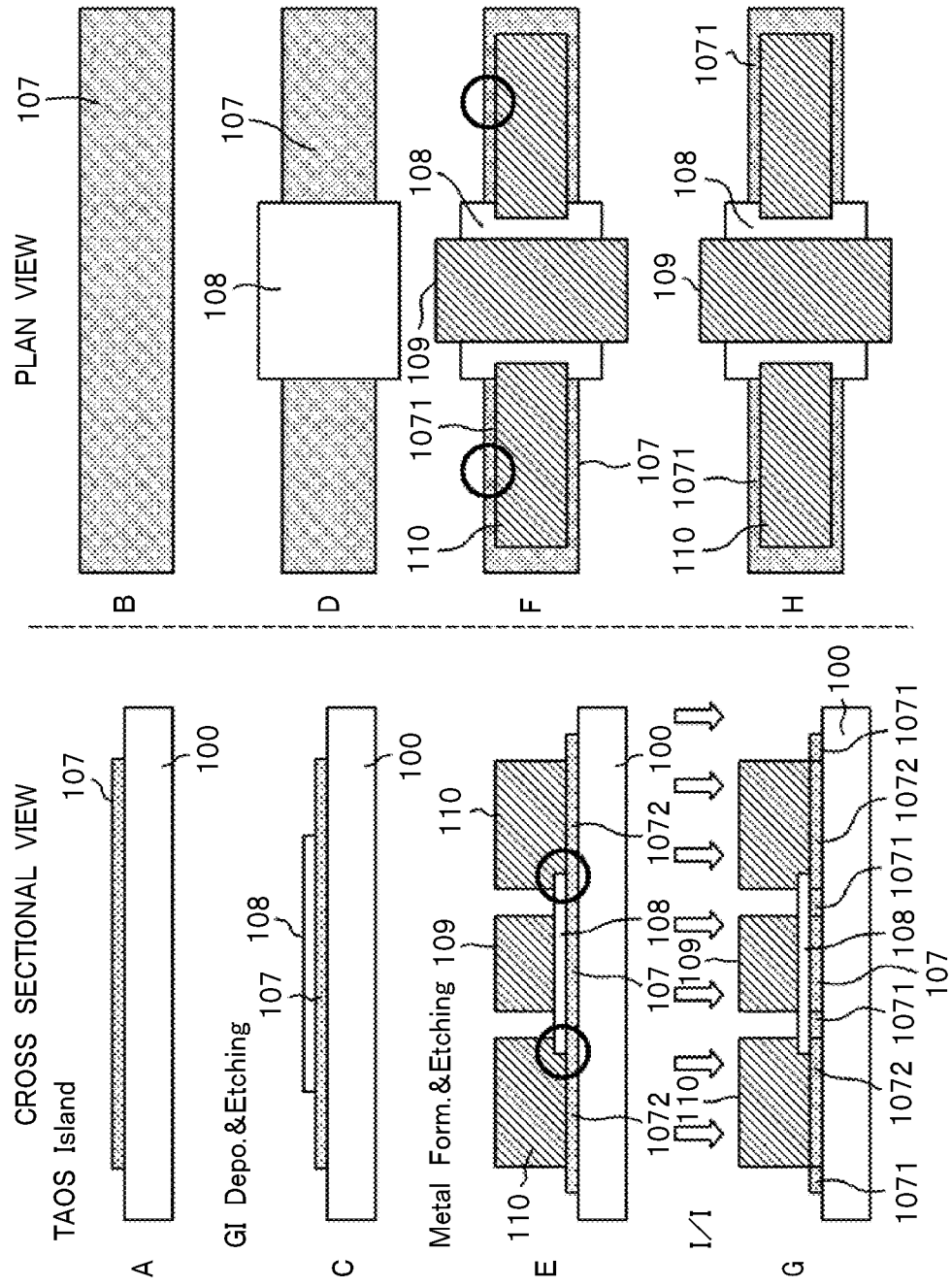
FIG. 17 is a second example of embodiment 3.

FIG. 17 is a second example of a structure of the TAOS TFT in embodiment 3. FIG. 17 differs from FIG. 16 in that, as depicted in E-F of FIG. 17, a part of the source/drain electrode 110 is formed on a part of the gate insulating film 108. Therefore, the current cannot flow into the source/drain electrode at the circled portions in E of FIG. 17; however, the current can flow into the source/drain electrode 110 at the circled portions in F of FIG. 17. Namely, after the ion implantation, the current can flow into the source/drain electrode 110 from the TAOS 107 at three sides of the source/drain electrode 110. The structure of FIG. 17 is used in some specific layouts; however, ON resistance doesn't change so much and performance of TFTs is actually the same between FIG. 16 and FIG. 17.

Figure 18:
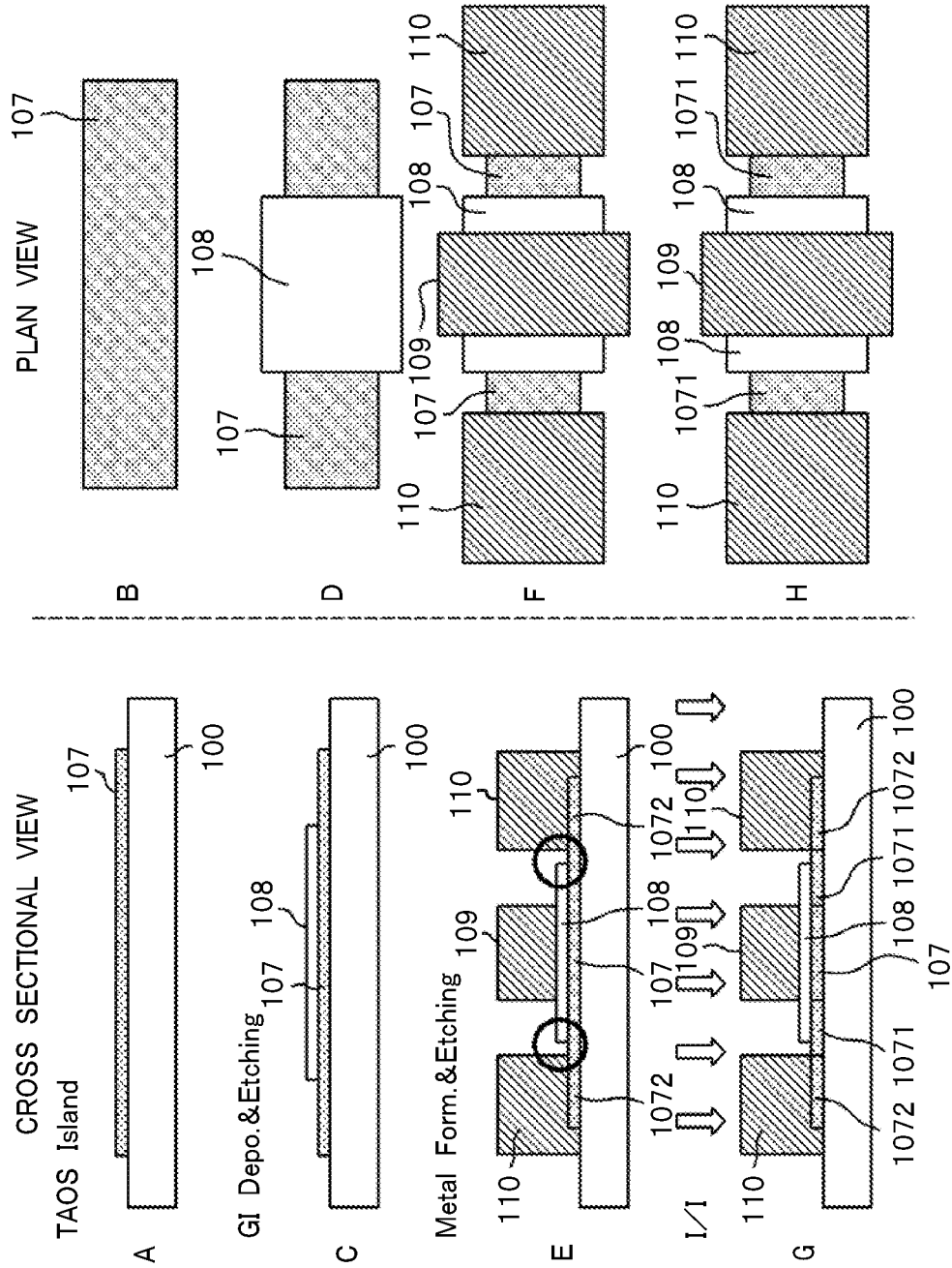
FIG. 18 is a third example of embodiment 3.

FIG. 18 is a third example of a structure of the TAOS TFT in embodiment 3. FIG. 18 differs from FIG. 16 in that, as depicted in E-H of FIG. 18, a width of the source/drain electrode 110 is wider than a width of TAOS 107; consequently, edges of the TAOS 107 are covered by the source/drain electrode 110 in FIG. 18. The width means a width in a direction of channel width. Therefore, the current flows into the source/drain electrode 110 at one side of the source/drain electrode 110 after the ion implantation depicted in G of FIG. 18. Namely, the current flows into the source/drain electrode 110 at the circled portions in E of FIG. 18. The structure of FIG. 18 is used in some specific layouts; however, ON resistance doesn't change so much and performance of TFTs is actually the same between FIG. 16 and FIG. 18.

Figure 19:
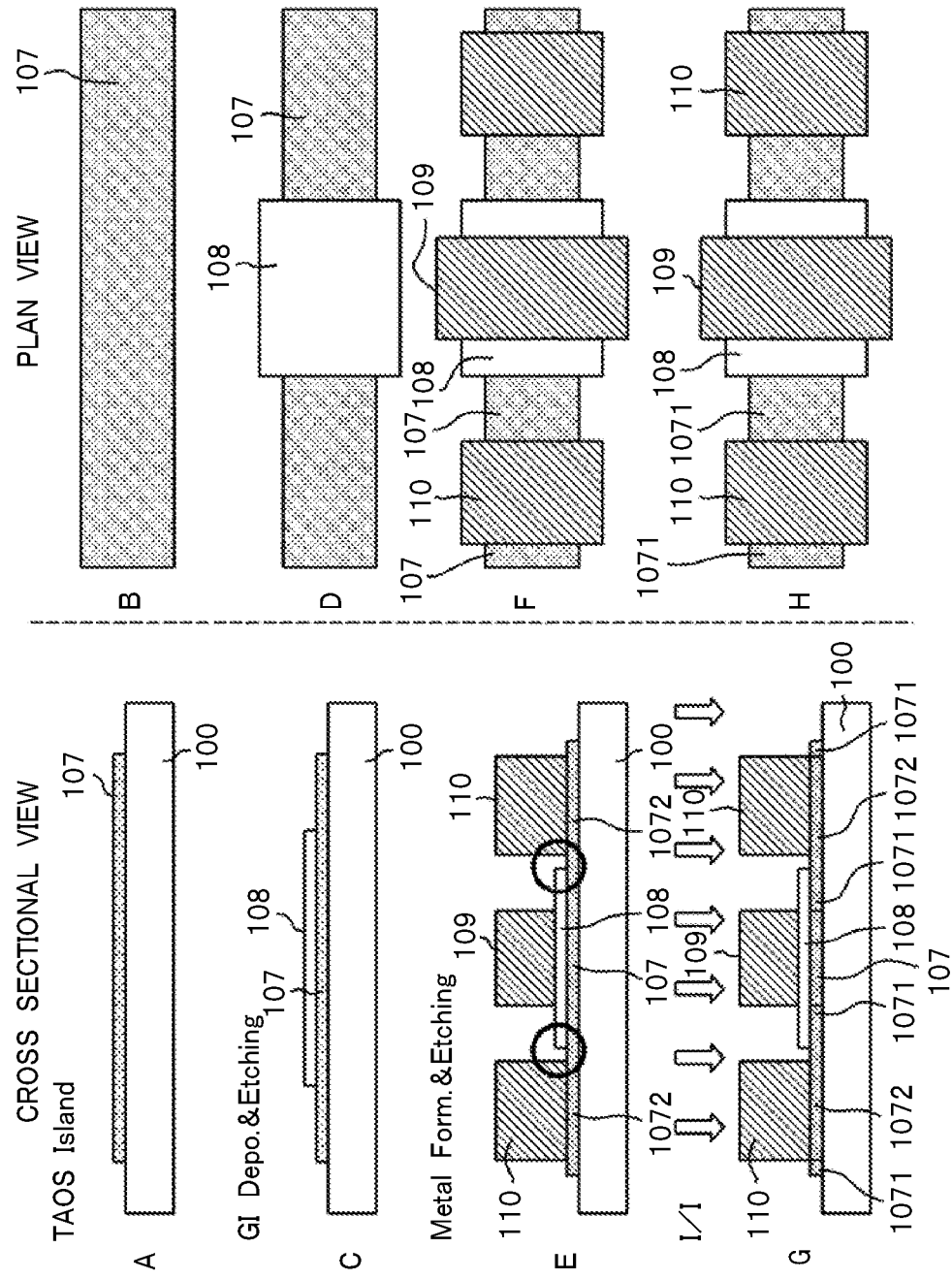
FIG. 19 is a fourth example of embodiment 3.

FIG. 19 is a fourth example of a structure of the TAOS TFT in embodiment 3. FIG. 19 differs from FIG. 16 in that, as depicted in E-H of FIG. 19, a width of the source/drain electrode 110 is wider than a width of TAOS 107. The width means a width in a direction of channel width. The structure of FIG. 19 is used in some specific layouts; however, ON resistance doesn't change so much and performance of TFTs is actually the same between FIG. 16 and FIG. 19.

Figure 20:
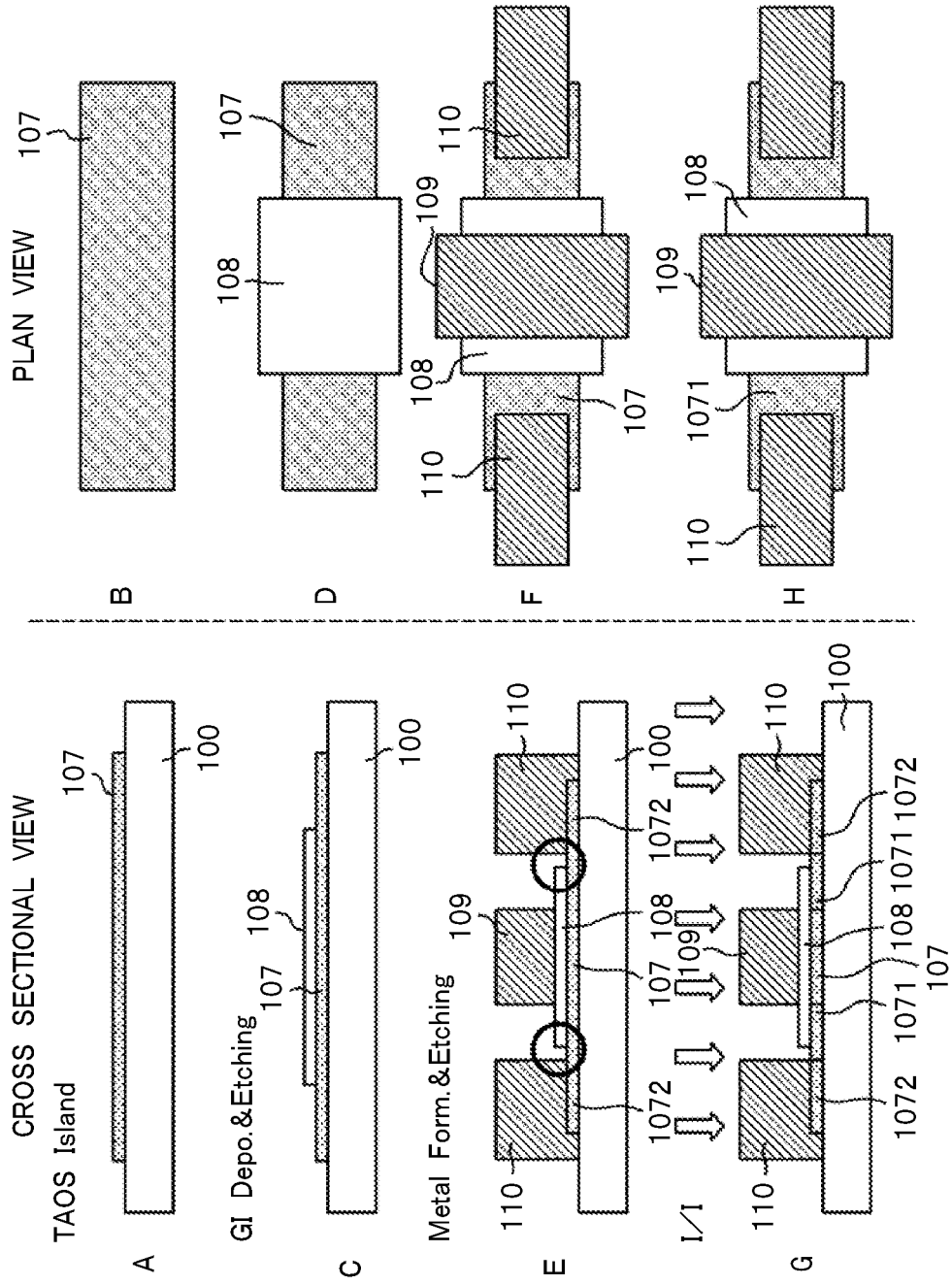
FIG. 20 is a fifth example of embodiment 3.

FIG. 20 is a fifth example of a structure of the TAOS TFT in embodiment 3. FIG. 20 differs from FIG. 16 in that, as depicted in E-H of FIG. 20, edges of the source/drain electrodes 110 extend beyond edges of TAOS 107. Therefore, after the ion implantation, as depicted in G of FIG. 20, the current can flow into the source/drain electrode 110 from TAOS 107 at three sides of the source/drain electrode 110. The circled portions in E of FIG. 20 are the routes that the current flows into the source/drain electrodes 110 after the ion implantation (I/I). The structure of FIG. 20 is used in some specific layouts; however, ON resistance doesn't change so much and performance of TFTs is actually the same between FIG. 16 and FIG. 20.

Figure 21:
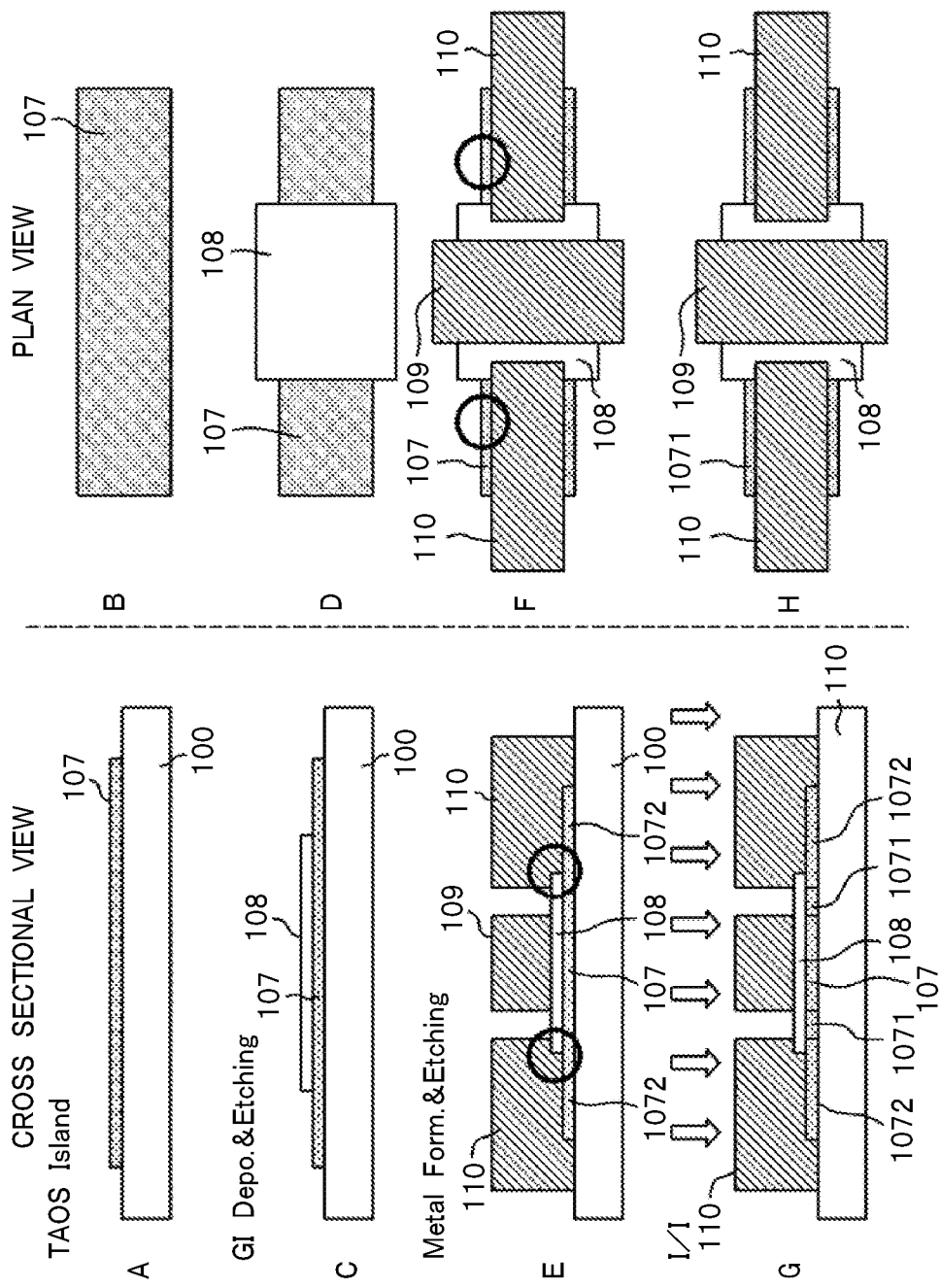
FIG. 21 is a sixth example of embodiment 3.

FIG. 21 is a sixth example of a structure of the TAOS TFT in embodiment 3. FIG. 21 differs from FIG. 20 in that, as depicted in E-H of FIG. 21, a part of the source/drain electrodes 110 is formed on a part of the gate insulating film 108. Therefore, after the ion implantation (I/I), as depicted in G of FIG. 21, ON current flows into the source/drain electrode 110 from two sides of the source/drain electrode 110. The circles in F of FIG. 21 are areas where the current can flow into the source/drain electrodes 110.

On the other hand, the current cannot flow to the source/drain electrodes 110 at the circled portions in E of FIG. 21. The reason is that conductivity doesn't reveal in the TAOS 107 at an area where the source/drain electrode 110 overlaps the gate insulating film 108. The structure of FIG. 21 is used in some specific layouts; however, ON resistance doesn't change so much and performance of TFTs is actually the same between FIG. 16 and FIG. 21.

Figure 22:
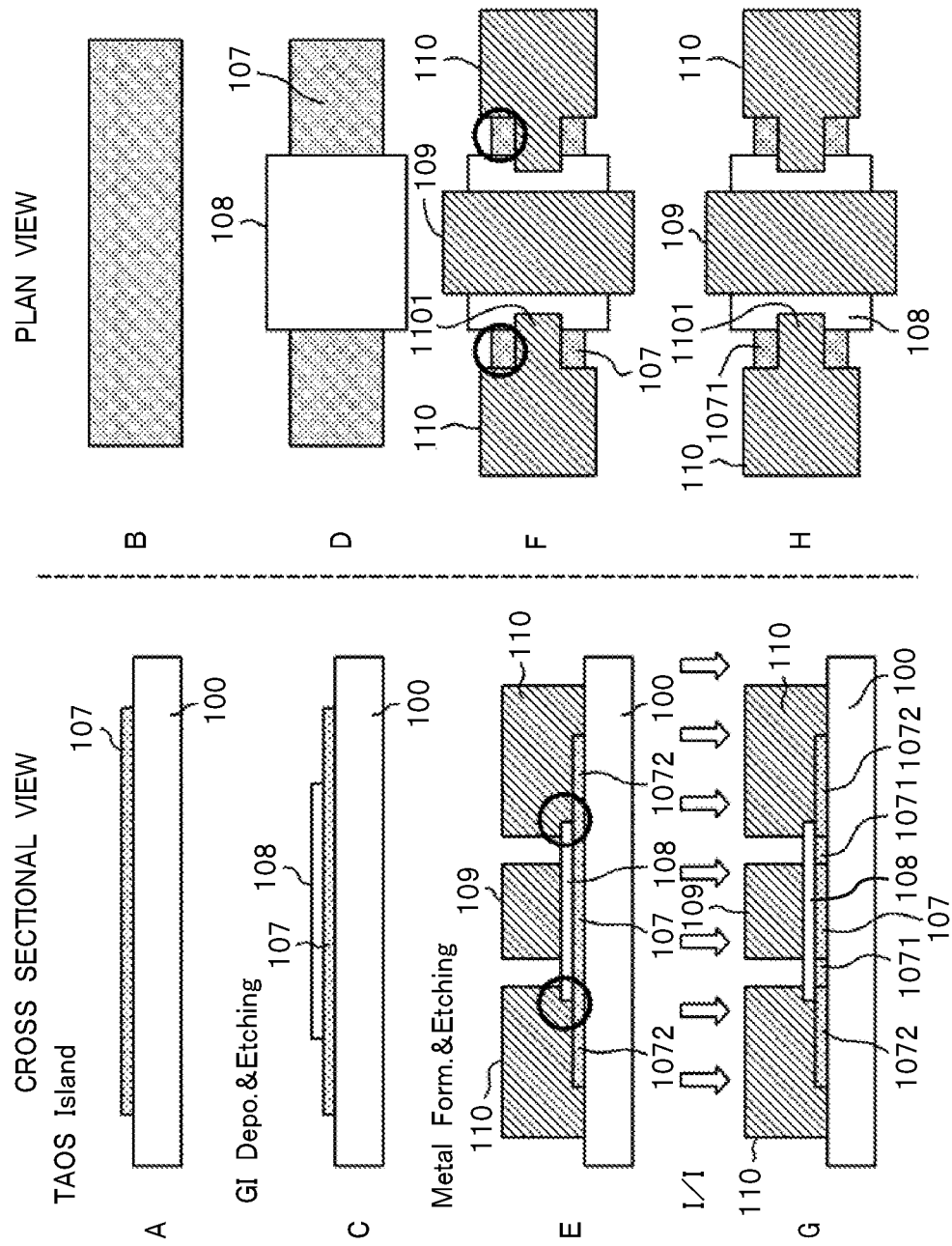
FIG. 22 is a seventh example of embodiment 3.

FIG. 22 is a seventh example of a structure of TAOS TFT in embodiment 3. FIG. 22 differs from FIG. 18 in that, as depicted in E-H of FIG. 22, the source/drain electrode 110 has a projection 1101, and the projection 1101 is formed on a part of the gate insulating film 108. The circled portions in E of FIG. 22 cannot be a route of the current, however, the circled portions in F of FIG. 22 can be routes for the current to flow into the source/drain electrodes 110 after the ion implantation. The structure of FIG. 22 is used in some specific layouts; however, ON resistance doesn't change so much and performance of TFTs is actually the same between FIG. 16 and FIG. 22.

A common feature through FIGS. 16-22 is that, in H of each of FIGS. 16-22, an exposed area of TAOS 107 adjacent to the source/drain electrode 110 forms a route for the current to the source/drain electrode 110.

Fourth Embodiment

Figure 23:
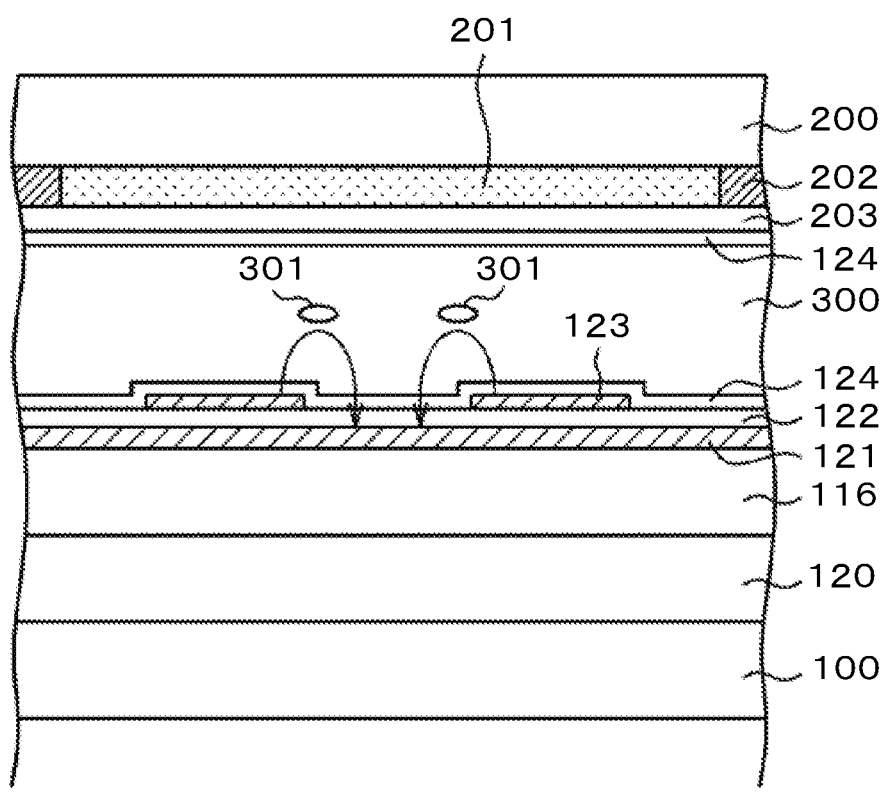
FIG. 23 is a cross sectional view of a display area of a liquid crystal display device.

FIG. 23 is a cross sectional view that the TAOS, explained in embodiments 1-3, is used in a display area of a liquid crystal display device. The TFT array layer 120 is formed on the TFT substrate 100. The TFT array layer 120 has the TAOS TFT array layer structure depicted by e.g. FIG. 8. The organic passivation film 116 is formed on the TFT array layer 120.

FIG. 23 is an IPS type liquid crystal display device where the common electrode 121 of a planar shape is formed on the organic passivation film 116. The capacitive insulating layer 122 is formed on the common electrode 121 and the pixel electrode 123 is formed on the capacitive insulating layer 122. The pixel electrode 123 is comb like shaped or stripe like shaped. The alignment layer 124, for intimal alignment of the liquid crystal molecules 301, is formed on the pixel electrode 123.

When a video signal is applied to the pixel electrode 123, then a potential difference is formed between the pixel electrode 123 and the common electrode 121, a line of force is generated as depicted by an arrow in FIG. 12, which rotates the liquid crystal molecules 301 and thus a transmittance of the liquid crystal layer 300 is controlled, consequently images are formed.

In FIG. 23, the counter substrate 200 is set above the TFT substrate 100 to sandwich the liquid crystal layer 300. The color filter 201 and the black matrix 202 are formed on the counter substrate 200. The overcoat film 203 is formed to cover the color filter 201 and the black matrix 202; the alignment film 204 is formed on the overcoat film 203.

In a liquid crystal display device, when a video signal is applied to the pixel electrode 123, a voltage is retained for one frame period by a storage capacitance formed between the pixel electrode 123 and the common electrode 122 sandwiching the capacitive insulating layer 122. In this case, if a leak in the TFT is large, the voltage of the pixel electrode 123 changes, thus, flickers occur; consequently, images are deteriorated. According to the present invention, a leak of the TFT can be made low, thus, a liquid crystal display device having high quality images is realized.

Fifth Embodiment

Figure 24:
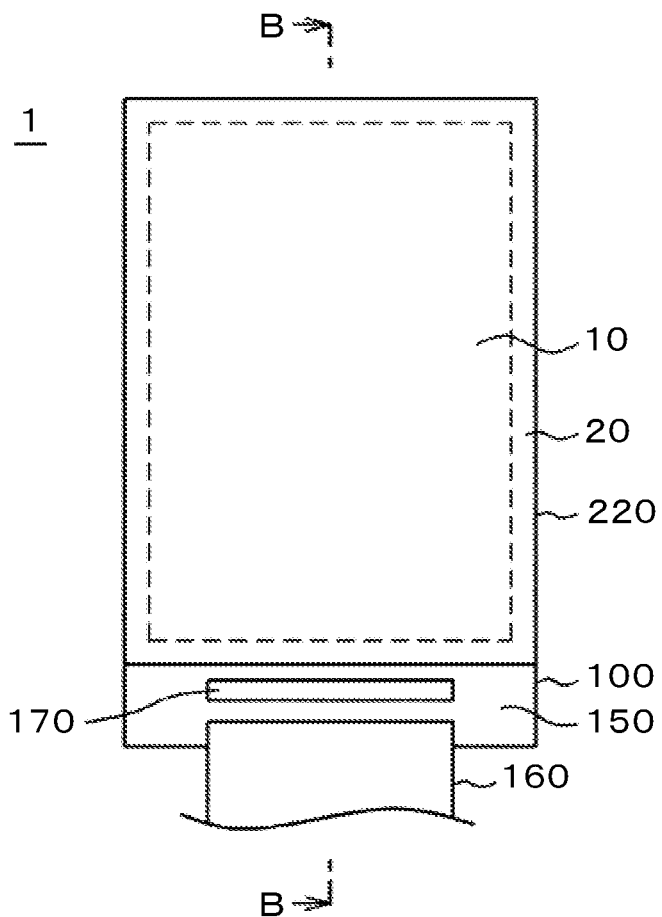
FIG. 24 is a plan view of an organic EL display device.

A combination of the LTPS TFTs and the TAOS TFTs explained in embodiments 1-3 can be applied to an organic EL display device. FIG. 24 is a plan view of an organic EL display device 2. The organic EL display device 2 of FIG. 24 has the display area 10 and the peripheral circuit area 20. Organic EL driving TFTs and switching TFTs are formed in the display area 10. A TAOS TFT, which has low leak current, is preferable for a TFT formed in the display area. A peripheral circuit is formed by mainly Poly-Si TFTs in the peripheral circuit area 20.

In FIG. 24, the polarizing plate 220 for preventing reflection is adhered to the display area 10. Since an organic EL display device has a reflection electrode, the polarizing plate 220 is used to prevent a reflection of external light. The terminal area 150 is formed outside of the display area 10.

The driver IC 170 is installed on the terminal area 150. The flexible wiring circuit plate 160, which supplies power or signals to the organic EL display, is connected to the terminal area 150.

Figure 25:
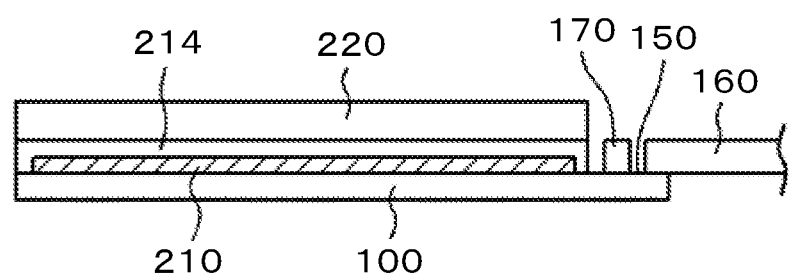
FIG. 25 is a cross sectional view along B-B of FIG. 24.

FIG. 25 is a cross sectional view of FIG. 24 along B-B line. The display element layer 210, which includes organic EL layers, is formed on the TFT substrate 100. The display element layer 210 is formed corresponding to the display area 10 of FIG. 24. Since an organic EL substance is decomposed by moisture, the protecting layer 214 made by SiN is formed to cover the display element layer 214. The terminal area 150 is formed outside of the display element layer 210; the driver IC 170 is installed on the terminal area 150 and the flexible wiring circuit plate 160 is connected to the terminal area 150.

Figure 26:
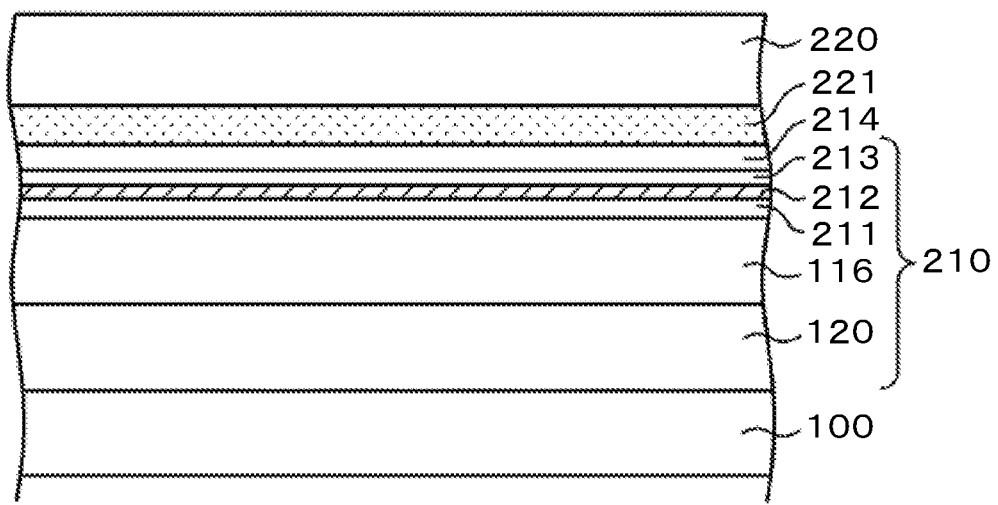
FIG. 26 is a cross sectional view of a display area of an organic EL display device.

FIG. 26 is a cross sectional view of the display area of the organic EL display device. The TFT array layer 120 is formed on the TFT substrate 100. The TFT array layer 120 includes the layer structure of TFT of FIG. 8; the organic passivation film 116 is formed on the TFT array layer 120.

The lower electrode 211 is formed on the organic passivation film 116 in FIG. 26. The lower electrode 211 is a laminated structure of metal or alloy constituting a reflection electrode and a transparent conductive film constituting an anode. The organic EL layer 212 is formed on the lower electrode 211. The organic EL layer 212 includes e.g. an electron injection layer, an electron transport layer, a light emitting layer, a hole transport layer, and a hole injection layer.

The upper electrode 213, which works as a cathode, is formed on the organic EL layer 212. The upper layer 213 is formed by a transparent conductive film such as IZO (Indium Zinc Oxide) or ITO (Indium Tin Oxide). The upper electrode 213 can also be made by thin film of metal as Silver or metal alloys. From the TFT array layer to the upper electrode 213 constitute the display element layer 210. The protecting layer 214 made by such as SiN is formed on the upper electrode 213; the polarizing plate 220 is adhered to the protecting layer 214 by the adhesive 221 to prevent a reflection of external light.

Several kinds of TFTs such as driving TFTs or switching TFTs are formed in the TFT array layer 120. According to the present invention, the LTPS TFTs and the TAOS TFTs can be formed by a common process, thus, various combinations of the LTPS TFTs and the TAOS TFTs are possible; consequently, an organic EL display device having high quality images and low power consumption can be realized.

In the above embodiments, the TAOS TFTs are used in the display area and the LTPS TFTs are used in the peripheral driving circuit; however, the TAOS TFTs can be added in the peripheral driving circuit or the LTPS TFTs can be added in the display area.

In the above embodiments, TFTs are explained as a top gate type where a gate electrode is above a semiconductor layer; however, the present invention is applicable to TFTs of a bottom gate type where a gate electrode is beneath a semiconductor layer.

What is claimed is:

1. A display device having a display area containing a pixel comprising:
   the pixel includes a first TFT having an oxide semiconductor,
   a gate insulating film is formed on the oxide semiconductor, a first gate electrode is formed on the gate insulating film,
   a first source/drain electrode formed by a metal or an alloy in contact with a source or a drain of the semiconductor,
   a first insulating film is formed to cover the oxide semiconductor, the gate electrode, and the first source/drain electrode, and a first through hole is formed in the first insulating film, and on the first source/drain electrode,
   a second source/drain electrode connects with the first source/drain electrode through the first through hole formed in the first insulating film, wherein
   the first source/drain electrode exists at a bottom of the first through hole formed in the first insulating film.

2. The display device according to claim 1,
   wherein the gate insulating film is formed in island shape to cover a channel of the first TFT, the gate insulating film does not exist between the first source/drain electrode and the oxide semiconductor.

3. The display device according to claim 1,
   wherein a channel of the first TFT connects with the first source/drain electrode via an ion doped area of the oxide semiconductor.

4. The display device according to claim 1,
   wherein a driving circuit is formed outside of the display area,
   the driving circuit includes a second TFT having Poly-Si semiconductor.

5. The display device according to claim 4,
   wherein the second TFT is covered by a second insulating film, the second insulating film is covered by the first insulating film,
   a third source/drain electrode connects with the Poly-Si semiconductor through a third through hole formed in the first insulating film and the second insulating film,
   the Poly-Si semiconductor exists at the bottom of the through hole in the second insulating film.

6. The display device according to claim 4,
   wherein the first TFT and second TFT are top gate type TFTs.

7. The display device according to claim 1,
   wherein the display device is a liquid crystal display device.

8. The display device according to claim 1,
   wherein the display device is an organic EL display device.

* * * * *